(12) United States Patent
Lee et al.

(10) Patent No.: US 11,776,436 B2
(45) Date of Patent: Oct. 3, 2023

(54) FOLDABLE DISPLAY DEVICE

(71) Applicant: LG Display Co., Ltd., Seoul (KR)

(72) Inventors: MinJic Lee, Paju-si (KR); HongSik Kim, Goyang-si (KR); Yeseul Han, Gimpo-si (KR); JeongOk Jo, Seoul (KR); Kwanghyun Choi, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 268 days.

(21) Appl. No.: 17/362,182

(22) Filed: Jun. 29, 2021

(65) Prior Publication Data

US 2021/0407344 A1 Dec. 30, 2021

(30) Foreign Application Priority Data

Jun. 30, 2020 (KR) .................. 10-2020-0080641

(51) Int. Cl.
*H10K 59/131* (2023.01)
*G09F 9/30* (2006.01)
*H10K 59/121* (2023.01)

(52) U.S. Cl.
CPC ......... *G09F 9/301* (2013.01); *H10K 59/1213* (2023.02); *H10K 59/131* (2023.02)

(58) Field of Classification Search
CPC ....... G09F 9/301; G09F 9/33; H10K 59/1213; H10K 59/131; H10K 50/87; H10K 77/111; H10K 50/84; H10K 50/856; H10K 2102/311; Y02E 10/549
See application file for complete search history.

(56) References Cited

U.S. PATENT DOCUMENTS

| 2014/0097408 A1 | 4/2014 | Kim et al. |
| 2015/0062465 A1* | 3/2015 | Her ............... G06F 3/0446 977/734 |
| 2019/0204867 A1 | 7/2019 | Song |
| 2020/0073495 A1 | 3/2020 | Bok |

FOREIGN PATENT DOCUMENTS

| CN | 101794540 A | 8/2010 |
| CN | 108694890 A | 10/2018 |
| CN | 110021235 A | 7/2019 |
| CN | 110518039 A | 11/2019 |
| CN | 110767086 A | 2/2020 |
| CN | 210112367 U | 2/2020 |

* cited by examiner

*Primary Examiner* — Kyoung Lee
(74) *Attorney, Agent, or Firm* — Birch, Stewart, Kolasch & Birch, LLP

(57) ABSTRACT

A foldable display device includes a display area having a plurality of unit pixels and a non-display area surrounding the display area, and a folding area defined in the display area and the non-display area, and non-folding areas on both sides of the folding area. The foldable display device can further include a first substrate, a second substrate corresponding to the first substrate and including the plurality of unit pixels, a thin film transistor disposed on the second substrate, an organic light emitting diode disposed on the thin film transistor, and a mesh pattern disposed between the first substrate and the second substrate and having a plurality of openings. Openings of the mesh pattern in the folding area are smaller in size than openings of the mesh pattern in the non-folding areas.

20 Claims, 17 Drawing Sheets

FOLDABLE DISPLAY DEVICE

CROSS-REFERENCE TO RELATED APPLICATIONS

This application claims the priority of Korean Patent Application No. 10-2020-0080641 filed on Jun. 30, 2020, in the Korean Intellectual Property Office, the entire contents of which are hereby expressly incorporated herein by reference into the present application.

BACKGROUND

Field

The present disclosure relates to a foldable display device in which the visibility of a pattern portion in a folding area can be improved and the occurrence of mura in the folding area during driving can be minimized.

Description of the Related Art

Recently, with the advancement of the information age, display devices for processing and displaying a large amount of information have been developed. Display devices used for a computer monitor, a TV, a mobile phone, etc. include an organic light emitting display (OLED) that emits light by itself, a liquid crystal display (LCD) that requires a separate light source, etc.

As the display devices have been increasingly applied to diverse fields, such as a computer monitor, a TV, and a personal mobile device, display devices having a large display area and a reduced volume and weight have been studied.

Specially, recently, flexible display devices manufactured to display an image even when bent or folded like paper have received attention as the next-generation display devices. The flexible display devices can be classified into an unbreakable display device which has a high durability by using a thin film transistor substrate made of plastic instead of glass, and a bendable display device which is capable of being bent without breaking. Also, the flexible display devices can also be classified into a rollable display device which is capable of being rolled, and a foldable display device which is capable of being folded. The flexible display devices are good in space usability, interior, and design and can be applied to various application fields.

Meanwhile, the foldable display device needs to be capable of being folded and unfolded. Therefore, a pattern portion is formed in a folding area of a structure that supports a display panel to secure flexibility, but while the foldable display device is not driven, the pattern portion can be seen from the outside. Also, heat generated while the foldable display device is driven may not be uniformly diffused in the folding area. Therefore, mura may occur due to a temperature difference, which causes degradation in display quality of the foldable display device.

SUMMARY OF THE INVENTION

An object to be achieved by the present disclosure is to provide a foldable display device in which the visibility of a pattern portion of a structure that supports a display panel can be improved.

Another object to be achieved by the present disclosure is to provide a foldable display device in which the occurrence of mura in a folding area during driving of the display device can be suppressed.

Objects of the present disclosure are not limited to the above-mentioned objects, and other objects, which are not mentioned above, can be clearly understood by those skilled in the art from the following descriptions.

According to an aspect of the present disclosure, the foldable display device includes a display area having a plurality of unit pixels and a non-display area surrounding the display area. The foldable display device further includes a folding area defined in the display area and the non-display area and non-folding areas on both sides of the folding area. The foldable display device includes a first substrate; a second substrate corresponding to the first substrate and having the plurality of unit pixels; and a thin film transistor disposed on the second substrate. The foldable display device further includes an organic light emitting diode disposed on the thin film transistor; and a mesh pattern disposed between the first substrate and the second substrate and including a plurality of openings. Openings of the mesh pattern in the folding area can be smaller in size than openings of the mesh pattern in the non-folding areas. For example, the foldable display device according to an exemplary embodiment of the present disclosure includes the mesh pattern made of metal and having the plurality of openings between the flexible substrates. Further, the openings of the mesh pattern increase in size from the folding area toward the non-folding areas. Therefore, the visibility of a pattern portion of a structure that supports a display panel can be improved, and the occurrence of mura in the folding area can be suppressed.

According to another aspect of the present disclosure, the foldable display device includes a folding area and a non-folding area. The foldable display device includes a support substrate having an opening pattern corresponding to the folding area; and a first substrate disposed on the support substrate. The foldable display device further includes a second substrate disposed on the first substrate and including a thin film transistor and an organic light emitting diode; and a mesh pattern disposed between the first substrate and the second substrate and having a plurality of openings. A line width of the mesh pattern in a folding boundary area between the folding area and the non-folding area can be smaller than a line width of the wiring line of the mesh pattern in the folding area and greater than a line width of the wiring line of the mesh pattern in the non-folding area.

Other detailed matters of the exemplary embodiments are included in the detailed description and the drawings.

According to the present disclosure, a foldable display device includes a mesh pattern made of metal and having a plurality of openings between flexible substrates. Further, the openings of the mesh pattern increase in size from a folding area to non-folding areas. Therefore, the reflectivity at a pattern portion of a structure that supports a display panel can be reduced, and, thus, it is possible to minimize visual recognition of the pattern portion.

Further, according to the present disclosure, heat generated from a display panel while a foldable display device is driven can be easily diffused, and, thus, it is possible to suppress the occurrence of mura in a folding area.

The effects and advantages of the present disclosure are not limited to the above-described effects and advantages. Although not described herein, other effects and advantages of the present disclosure can be clearly understood by a person with ordinary skill in the art from the following descriptions.

The effects and advantages according to the present disclosure are not limited to the contents exemplified above, and more various effects and advantages are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
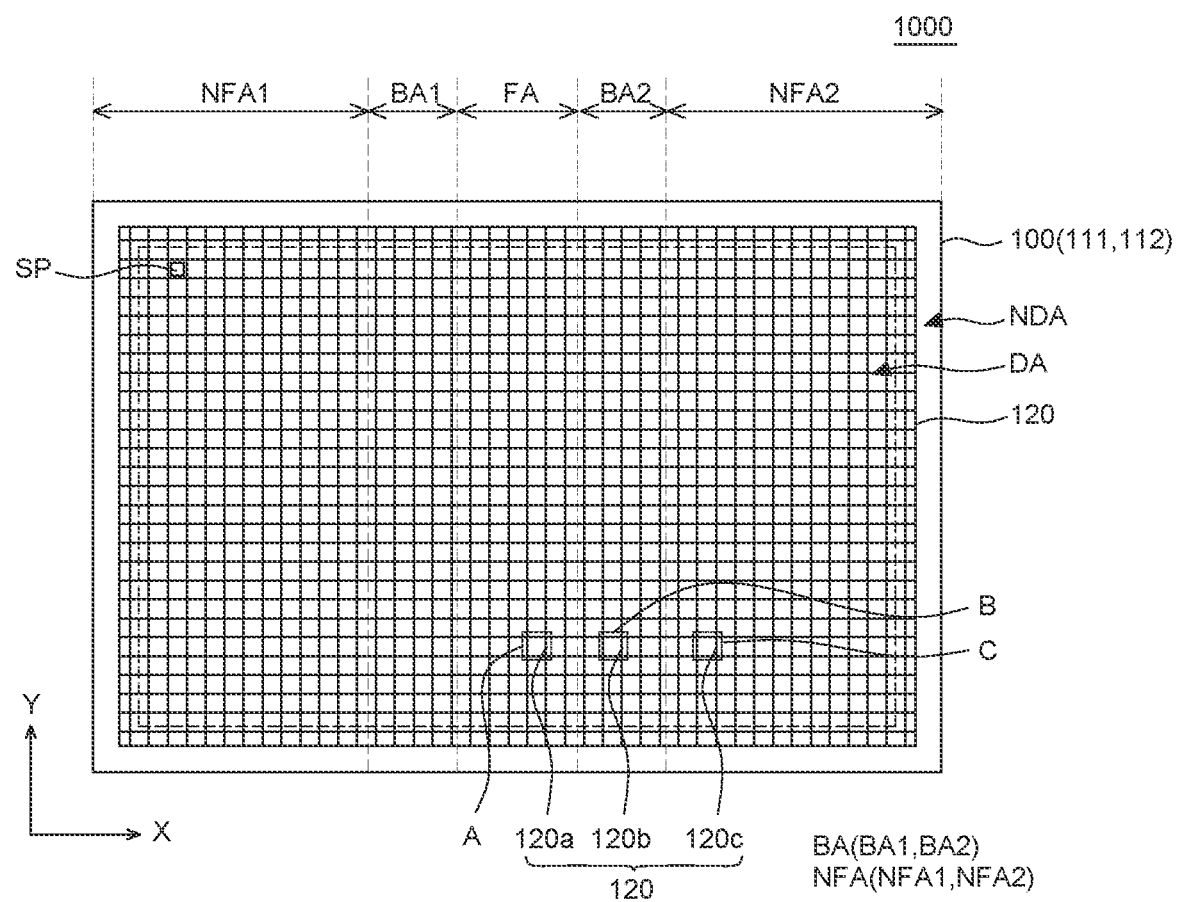
FIG. 1 is a plan view of a foldable display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components and may not necessarily define order. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a foldable display device according to exemplary embodiments of the present disclosure will be described in detail with reference to accompanying drawings.

FIG. 1 is a plan view of a foldable display device according to an exemplary embodiment of the present disclosure. All components of each foldable display device according to all embodiments of the present disclosure are operatively coupled and configured.

Referring to FIG. 1, a display panel 100 of a foldable display device 1000 according to an exemplary embodiment of the present disclosure includes a display area DA and a non-display area NDA. Further, the display panel 100 of the foldable display device 1000 according to an exemplary embodiment of the present disclosure includes a folding area FA, non-folding areas NFA1 and NFA2 except the folding area FA, and folding boundary areas BA1 and BA2 between the folding area FA and the non-folding areas NFA1 and NFA2.

More specifically, the display panel 100 refers to any type of a display substrate configured to display an image using a transistor circuit. The foldable display device 1000 according to an exemplary embodiment of the present disclosure can be implemented as an organic light emitting display, but is not limited thereto. The foldable display device 1000 according to an exemplary embodiment of the present disclosure can be applied to a quantum dot display device, a micro light emitting diode (μ-LED) display device, and the like.

Substrates 111 and 112 on which the display panel 100 of the foldable display device 1000 according to an exemplary embodiment of the present disclosure is formed can have flexibility. For example, the substrates 111 and 112 can be made of a polymer material, such as polyimide (PI), or a plastic material.

Referring to FIG. 1, the display area DA is provided on the entire surface of the display panel 100. The display area DA is configured to display an image, and a plurality of sub-pixels SP is disposed in the display area DA.

In the display area DA, sub-pixels SP including emission areas for displaying an image and driving circuits for driving the sub-pixels SP can be disposed. Each sub-pixel SP is configured to display a color, and includes an emission area EA where light is emitted and a non-emission area NEA where light is not emitted.

A plurality of sub-pixels SP in the display area DA can form a pixel P, and a plurality of pixels P each including a plurality of sub-pixels SP can substantially display an image. Further, a plurality of pixels P can be disposed adjacent to each other and can form a unit. Therefore, unit pixels UP can be disposed repeatedly inside the display area DA.

The non-display area NDA is disposed outside the display area DA so as to surround the display area DA. For example, the non-display area NDA can be formed to surround the display area DA. The non-display area NDA refers to an area that does not substantially display an image. In the non-display area NDA, circuits for supplying driving signals and driving voltages to enable the display area DA to display an image are provided.

In the non-display area NDA, various wiring lines, driver ICs, a printed circuit board and the like for driving the pixels and driving circuits disposed in the display area DA are disposed. For example, various ICs, such as a gate driver IC and a data driver IC, and VSS lines can be disposed in the non-display area NDA.

Referring to FIG. 1, the folding area FA refers to a folded area when the foldable display device 1000 is folded. The display panel 100 can be folded or bent with a specific radius of curvature around a folding axis. For example, the folding area FA refers to an area where the display panel 100 can be folded or bent. The folding area FA can include the display area DA and the non-display area NDA.

The folding area FA can be formed across the display area DA and the non-display area NDA. When the display panel 100 is folded or bent, the folding area FA can be formed from one side edge to the other edge of the display panel 100. In this case, the folding area FA is extended from an outer boundary of the non-display area NDA and formed across from one side to the other side of the display area DA.

For example, when a central portion of the display panel 100 is folded, the folding area FA can be formed to span a central portion of the display area DA and the non-display area NDA.

The non-folding areas NFA1 and NFA2 refer to non-folded areas when the foldable display device 1000 is folded. For example, the non-folding areas NFA1 and NFA2 maintain a flat state when the foldable display device 1000 is folded. The non-folding areas NFA1 and NFA2 can be located on both sides of the folding area FA. For example, if a folding axis of the folding area FA is formed in a Y-axis direction, the non-folding areas NFA1 and NFA2 are defined as extending from the folding area FA in an X-axis direction perpendicular to the folding axis. For example, the folding area FA is formed between the two adjacent non-folding areas NFA1 and NFA2.

When the foldable display device 1000 is folded, the folding area FA is folded around the folding axis and the folding area FA forms a part of a circle or an oval. Here, the radius of curvature of the folding area FA refers to the radius of the circle or oval formed by the folding area FA. When the folding area FA is folded around the folding axis, the non-folding areas NFA1 and NFA2 can overlap each other.

Referring to FIG. 1, the foldable display device 1000 according to an exemplary embodiment of the present disclosure can include the folding boundary areas BA1 and BA2 between the folding area FA and the non-folding areas NFA1 and NFA2. For example, a first folding boundary area BA1 is disposed between the folding area FA and the first non-folding area NFA1, and a second folding boundary area BA2 is disposed between the folding area FA and the second non-folding area NFA2.

A first non-folding area NFA1 and a second non-folding area NFA2 can be disposed respectively corresponding to both edge areas of an opening pattern 165 formed in a support substrate 160 disposed under the display panel 100.

Referring to FIG. 1, the foldable display device 1000 according to an exemplary embodiment of the present disclosure can include the display area DA having unit pixels composed of a plurality of pixels P and the non-display area NDA surrounding the display area DA. Further, the foldable display device 1000 can include the folding area FA and the non-folding areas NFA1 and NFA2 on both sides of the folding area FA defined in the display area DA and the non-display area NDA.

Further, referring to FIG. 1, the foldable display device 1000 according to an exemplary embodiment of the present disclosure can include the folding boundary areas BA1 and BA2 between the folding area FA and the non-folding areas NFA1 and NFA2. For example, the foldable display device 1000 can include the first folding boundary area BA1 between the folding area FA and the first non-folding area NFA1, and the second folding boundary area BA2 between the folding area FA and the second non-folding area NFA2.

Referring to FIG. 1, the foldable display device 1000 according to an exemplary embodiment of the present disclosure can include a first substrate 111 on which components of the foldable display panel 100 are formed, and a second substrate 112 disposed on the first substrate 111. A mesh pattern 120 having a plurality of openings OA can be formed on the first substrate 111. For example, the foldable display device 1000 according to an exemplary embodiment of the present disclosure can include the mesh pattern 120 having the plurality of openings OA between the first substrate 111 and the second substrate 112.

The mesh pattern 120 of the foldable display device 1000 according to an exemplary embodiment of the present disclosure reduces the reflectivity at a pattern portion 165 formed in the folding area FA of the support substrate 160, which is a structure disposed under the display panel 100 and configured to support the display panel 100. Therefore, the mesh pattern 120 can function to minimize a user's visual recognition of the pattern portion 165. Further, the mesh pattern 120 can easily diffuse heat generated from the display panel 100 while the foldable display device 1000 is driven. Therefore, the mesh pattern 120 can function to suppress the occurrence of mura in the folding area FA.

Referring to FIG. 1, the mesh pattern 120 of the foldable display device 1000 according to an exemplary embodiment of the present disclosure is greater in size than the display area DA. Further, the mesh pattern 120 is smaller in size than the first substrate 111 or the second substrate 112. Thus, the mesh pattern 120 made of a metal material is not exposed to the outside of the first substrate 111 or the second substrate 112. Therefore, it is possible to suppress corrosion of the mesh pattern 120.

Further, in the foldable display device 1000 according to an exemplary embodiment of the present disclosure, the openings OA of the mesh pattern 120 in the non-display area NDA can be identical in size to the openings OA of the mesh pattern 120 in the adjacent display area DA.

Figure 2:
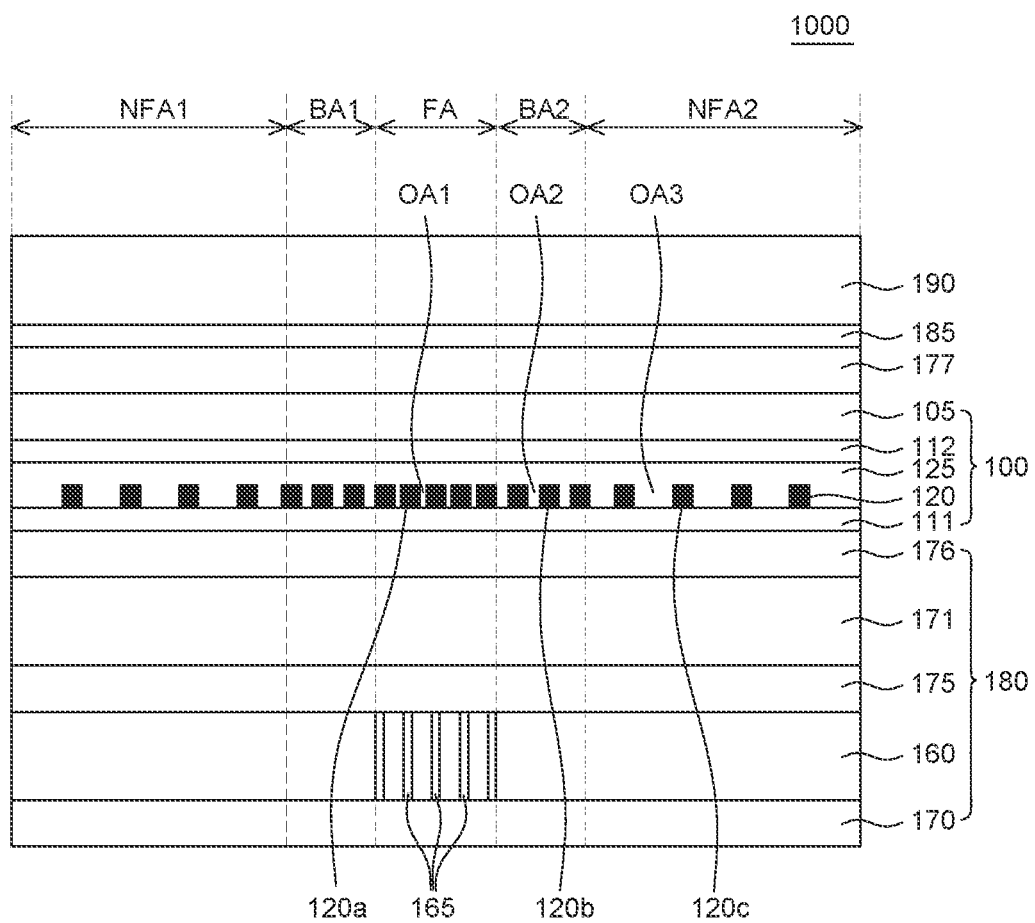
FIG. 2 is a cross-sectional view of the foldable display device according to an exemplary embodiment of the present disclosure.

Referring to FIG. 1 and FIG. 2, the foldable display device 1000 according to an exemplary embodiment of the present disclosure can include a plurality of first mesh patterns 120a having first openings OA1 in the folding area FA.

Further, referring to FIG. 1 and FIG. 2, the foldable display device 1000 according to an exemplary embodiment of the present disclosure can include a plurality of second mesh patterns 120b having second openings OA2 in each of the first folding boundary area BA1 and the second folding boundary area BA2, which are the folding boundary areas BA1 and BA2. The first folding boundary area BA1 can be formed to have openings identical in size to the second opening OA2 in the second folding boundary area BA2.

Further, referring to FIG. 1 and FIG. 2, the foldable display device 1000 according to an exemplary embodiment of the present disclosure can include a plurality of third mesh patterns 120c having third openings OA3 in each of the first non-folding area NFA1 and the second non-folding area NFA2, which are the non-folding areas NFA1 and NFA2. The first non-folding area NFA1 can be formed to have openings identical in size to the third opening OA3 in the second non-folding area NFA2.

Referring to FIG. 1 and FIG. 2, in the foldable display device 1000 according to an exemplary embodiment of the present disclosure, the openings OA1 of the mesh patterns 120a in the folding area FA can be formed smaller in size than the openings OA3 of the mesh patterns 120c in the non-folding areas NFA1 and NFA2.

Further, referring to FIG. 1 and FIG. 2, in the foldable display device 1000 according to an exemplary embodiment of the present disclosure, the openings OA1 of the mesh patterns 120a in the folding area FA can be formed smaller in size than the openings OA2 of the mesh patterns 120b in the folding boundary areas BA1 and BA2.

Further, referring to FIG. 1 and FIG. 2, in the foldable display device 1000 according to an exemplary embodiment of the present disclosure, the openings OA2 of the mesh patterns 120b in the folding boundary areas BA1 and BA2 can be formed smaller in size than the openings OA3 of the mesh patterns 120c in the non-folding areas NFA1 and NFA2.

For example, in the foldable display device 1000 according to an exemplary embodiment of the present disclosure, the openings OA2 of the mesh patterns 120b in the folding boundary areas BA1 and BA2 can be greater in size than the openings OA1 of the mesh patterns 120a in the folding area FA. Further, the openings OA2 of the mesh patterns 120b in the folding boundary areas BA1 and BA2 can be smaller in size than the openings OA3 of the mesh patterns 120c in the non-folding areas NFA1 and NFA2.

FIG. 2 is a cross-sectional view of the foldable display device 1000 according to an exemplary embodiment of the present disclosure.

Referring to FIG. 2, the foldable display device 1000 according to an exemplary embodiment of the present disclosure can include the display panel 100 including the first substrate 111 and the second substrate 112 which have flexibility and display panel components 105 formed on the second substrate 112.

Specifically, in the foldable display device 1000 according to an exemplary embodiment of the present disclosure, the display panel 100 includes the first substrate 111 and the second substrate 112, which are very thin flexible substrates, to achieve flexibility and foldability. The first substrate 111 and the second substrate 112 can be made of insulating materials having flexibility. For example, the first substrate 111 and the second substrate 112 can be made of an insulating plastic selected from polyimide, polyethersulfone, polyethylene terephthalate and polycarbonate.

Referring to FIG. 2, the foldable display device 1000 according to an exemplary embodiment of the present disclosure can include the mesh pattern 120 having the plurality of openings OA on the first substrate 111. For example, the foldable display device 1000 according to an exemplary embodiment of the present disclosure can include the mesh pattern 120 having the plurality of openings OA disposed between the first substrate 111 and the second substrate 112.

Referring to FIG. 2, the foldable display device 1000 according to an exemplary embodiment of the present disclosure can include the plurality of first mesh patterns 120a having the first openings OA1 in the folding area FA. The foldable display device 1000 can include the plurality of second mesh patterns 120b having the second openings OA2 in each of the first folding boundary area BA1 and the second folding boundary area BA2, which are the folding boundary areas BA1 and BA2. Further, the foldable display device 1000 can include the plurality of third mesh patterns 120c having the third openings OA3 in each of the first non-folding area NFA1 and the second non-folding area NFA2, which are the non-folding areas NFA1 and NFA2.

Referring to FIG. 2, in the foldable display device 1000 according to an exemplary embodiment of the present disclosure, the openings OA1 of the mesh patterns 120a in the folding area FA can be formed smaller in size than the openings OA3 of the mesh patterns 120c in the non-folding areas NFA1 and NFA2.

Further, referring to FIG. 2, in the foldable display device 1000 according to an exemplary embodiment of the present disclosure, the openings OA1 of the mesh patterns 120a in the folding area FA can be formed smaller in size than the openings OA2 of the mesh patterns 120b in the folding boundary areas BA1 and BA2.

Further, Referring to FIG. 2, in the foldable display device 1000 according to an exemplary embodiment of the present disclosure, the openings OA2 of the mesh patterns 120b in the folding boundary areas BA1 and BA2 can be formed smaller in size than the openings OA3 of the mesh patterns 120c in the non-folding areas NFA1 and NFA2.

Furthermore, referring to FIG. 2, the display panel 100 can include an insulating layer 125 between the first substrate 111 and the second substrate 112. The insulating layer 125 can be formed to fully cover the mesh pattern 120.

Referring to FIG. 2, in the foldable display device 1000 according to an exemplary embodiment of the present disclosure, a support structure 180 is disposed under the display panel 100. The support structure 180 is a plate-type frame configured to protect and support the display panel 100. The support structure 180 supports the first substrate 111 and the second substrate 112 of the display panel 100 so as not to sag. Further, the support structure 180 protects the components disposed on the first substrate 111 and the second substrate 112 against moisture, heat, impact, etc. form the outside. The support structure 180 can be fixed to the display panel 100 by an adhesive material or the like.

Referring to FIG. 2, the support structure 180 includes the support substrate 160, a back plate 171, an impact absorption layer 170, a cover window 190, a first adhesive layer 175, a second adhesive layer 176 and a third adhesive layer 177.

Referring to FIG. 2, the foldable display device 1000 according to an exemplary embodiment of the present disclosure includes the first folding boundary area BA1 between the folding area FA and the first non-folding area NFA1, and the second folding boundary area BA2 between the folding area FA and the second non-folding area NFA2. The first folding boundary area BA1 and the second folding boundary area BA2 can be disposed respectively corresponding to both edge areas of the opening pattern 165 in the support substrate 160.

Referring to FIG. 2, the back plate 171 is configured to enhance the strength of the support structure 180 and support the display panel 100 together with the support substrate 160, and can be referred to as a top plate. The back plate 171 functions to maintain a constant radius of curvature of the display panel 100 while the foldable display device 1000 is folded. Further, the back plate 171 functions to suppress the occurrence of creases on a top surface of the display panel 100. The back plate 171 is disposed between the support substrate 160 and the display panel 100 and can be made of a transparent organic material.

A polarizing film 185 can be disposed on the display panel 100. The polarizing film 185 polarizes light emitted from the display panel 100 at a polarization angle. The polarizing film 185 emits the light polarized at the polarization angle to the outside. The polarizing film 185 can function to suppress reflection of external light except the light polarized at the polarization angle.

The cover window 190 can be disposed on the polarizing film 185. The cover window 190 protects the display panel 100 against impact from the outside. The cover window 190 can be implemented as a foldable flexible plastic-based cover to achieve thinness and flexibility of the foldable display device 1000.

Referring to FIG. 2, the first adhesive layer 175 can be disposed between the support substrate 160 and the back plate 171, and the second adhesive layer 176 can be disposed between the back plate 171 and the first substrate 111. Further, the third adhesive layer 177 can be disposed between the display panel 100 and the polarizing film 185.

The first adhesive layer 175 can be uniformly disposed on the entire top surface of the support substrate 160 to bond the support substrate 160 and the back plate 171. Further, the second adhesive layer 176 can be uniformly disposed on the entire top surface of the back plate 171 to bond the back plate 171 and the first substrate 111. Further, the third adhesive layer 177 can be uniformly disposed on the entire top surface of the display panel 100 to bond the display panel 100 and the polarizing film 185.

The first adhesive layer 175, the second adhesive layer 176 and the third adhesive layer 177 can be formed as transparent adhesive layers of, for example, optical clear resin (OCR), optical clear adhesive (OCA), or the like, but are not limited thereto.

Figure 3:
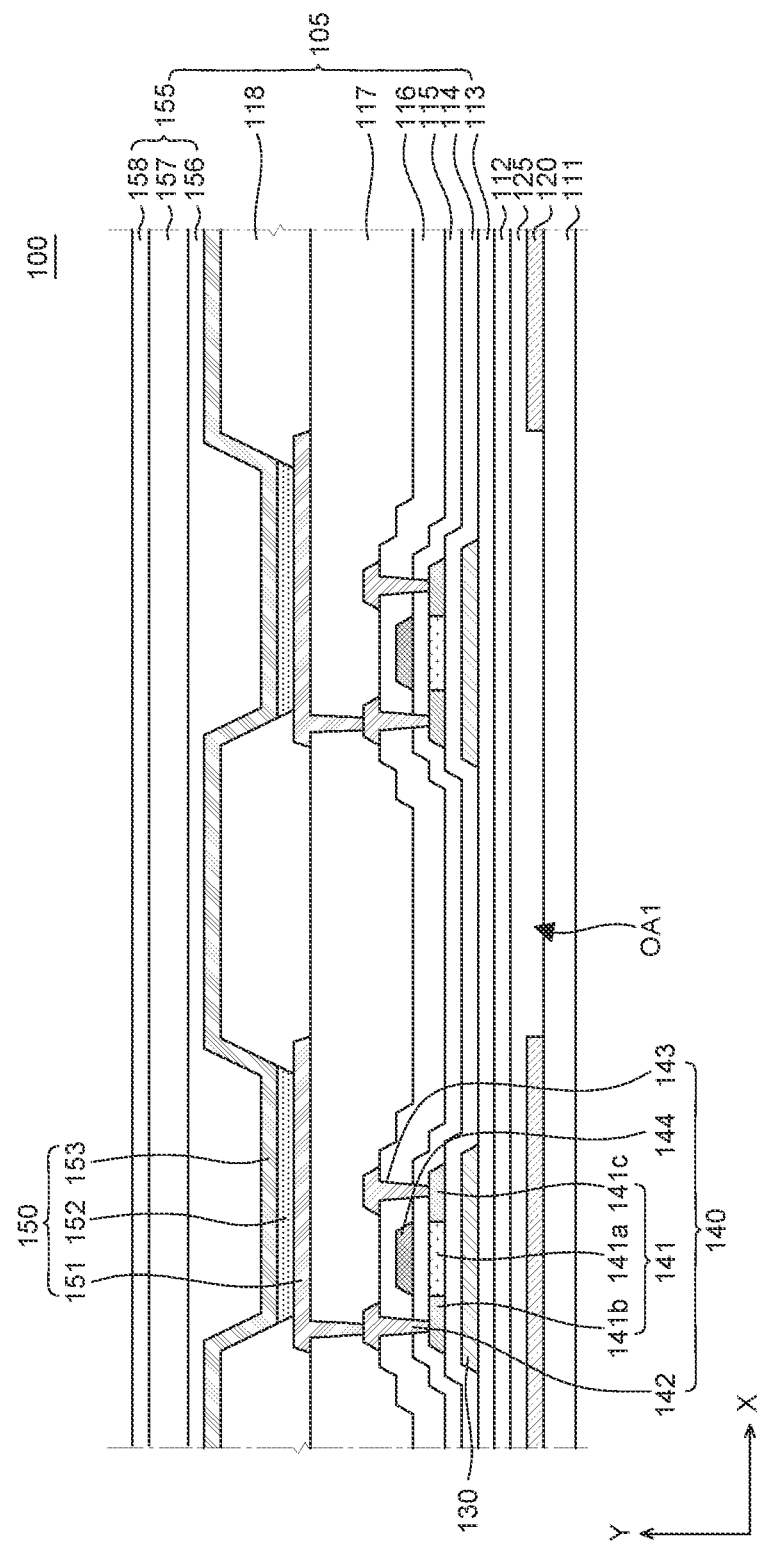
FIG. 3 is a cross-sectional view of a display panel of the foldable display device according to an exemplary embodiment of the present disclosure.

FIG. 3 is a cross-sectional view of the display panel 100 of the foldable display device 1000 according to an exemplary embodiment of the present disclosure.

For example, FIG. 3 is a schematic cross-sectional view of two sub-pixels SP of the display panel 100 of the foldable display device 1000 according to an exemplary embodiment of the present disclosure.

Referring to FIG. 3, the second substrate 112 is disposed on the first substrate 111 so as to correspond to the first substrate 111. The second substrate 112 is configured to support various display panel components 105 of the foldable display device 1000. The second substrate 112 can be made of the same material as the first substrate 111, and can be made of plastic such as polyimide, but is not limited thereto.

Referring to FIG. 3, the mesh pattern 120 having a plurality of openings OA1 is formed on the first substrate 111. For example, the mesh pattern 120 having a plurality of openings OA1 is disposed between the first substrate 111 and the second substrate 112.

The mesh pattern 120 of the foldable display device 1000 according to an exemplary embodiment of the present disclosure reduces the reflectivity at the pattern portion 165 formed in the folding area FA of the support substrate 160, which is a structure disposed under the display panel 100 and configured to support the display panel 100. Therefore, the mesh pattern 120 can function to minimize the user's visual recognition of the pattern portion 165. Further, the mesh pattern 120 can easily diffuse heat generated from the display panel 100 while the foldable display device 1000 is driven. Therefore, the mesh pattern 120 can function to suppress the occurrence of mura in the folding area FA.

The mesh pattern 120 can be formed as an opaque metal layer having high reflectivity and low resistance by photo lithography. For example, the mesh pattern 120 can be formed as a metal layer of copper (Cu), molybdenum (Mo) and aluminum (Al), but is not limited thereto.

Referring to FIG. 3, the insulating layer 125 can be disposed on the first substrate 111 and the mesh pattern 120. The insulating layer 125 can be formed to fully cover the mesh pattern 120. Specifically, the foldable display panel 100 of the foldable display device 1000 according to an exemplary embodiment of the present disclosure can further include the insulating layer 125 between the first substrate 111 and the second substrate 112. The insulating layer 125 can be formed to fully cover the mesh pattern 120. Thus, the mesh pattern 120 is not exposed to the outside of the first substrate 111 or the second substrate 112. Therefore, it is possible to suppress a defect caused by corrosion which can occur when the mesh pattern 120 made of a metal material is exposed to the outside.

Referring to FIG. 3, a buffer layer 113 is disposed on the second substrate 112. The buffer layer 113 functions to enhance adhesion between the layers formed on the buffer layer 113 and the second substrate 112 and block alkali elements discharged from under the buffer layer 113. The buffer layer 113 can be formed as a single layer of silicon nitride (SiNx) or silicon oxide (SiOx), or a multi-layer of silicon nitride (SiNx) and silicon oxide (SiOx), but is not limited thereto. However, the buffer layer 113 can be omitted depending on the type and material of the second substrate 112 or the structure and type of a transistor 140.

Referring to FIG. 3, a plurality of barrier metal layers 130 is disposed on the buffer layer 113. The plurality of barrier metal layers 130 functions to protect active layers 141 of a plurality of thin film transistors 140. The plurality of barrier metal layers 130 can be disposed to overlap the active layers 141 of the plurality of thin film transistors 140, respectively, on the buffer layer 113. In a cross-sectional view, each of the plurality of barrier metal layers 130 can have a width equal to or greater than that of the active layer 141 of each of the plurality of transistors 140. The plurality of barrier metal layers 130 can be made of various metal materials and can be in a floating state in which a voltage is not applied thereto. Alternatively, a constant voltage can be applied thereto.

Referring to FIG. 3, an active buffer 114 is disposed on the plurality of barrier metal layers 130 and the buffer layer 113. The active buffer 114 is an insulating layer to insulate the plurality of barrier metal layers 130 from the active layers 141 of the transistors 140. The active buffer 114 can be formed of the same material as the buffer layer 113. For example, the active buffer 114 can be formed as a single layer of silicon nitride (SiNx) or silicon oxide (SiOx), or a multi-layer of silicon nitride (SiNx) and silicon oxide (SiOx), but is not limited thereto.

Referring to FIG. 3, the thin film transistor 140 is disposed on the active buffer 114. Specifically, the thin film transistor 140 can have a top gate coplanar structure, but is not necessarily limited thereto.

Specifically, the active layer 141 of the thin film transistor 140 is disposed on the active buffer 114. The active layer 141 can be made of low-temperature poly-silicon (LTPS) or oxide semiconductor, but is not limited thereto. The active layer 141 includes a channel region 141a where a channel is formed, a source region 141b connected to a source electrode 142 and a drain region 141c connected to a drain electrode 143.

Referring to FIG. 3, a gate insulating layer 115 is formed on the active layer 141. The gate insulating layer 115 can be formed as a single layer of silicon nitride (SiNx) or silicon oxide (SiOx), or a multi-layer of silicon nitride (SiNx) and silicon oxide (SiOx). In the gate insulating layer 115, contact holes for contact between the source electrode 142 and the drain electrode 143, respectively, of the transistor 140 and the source region 141b and the drain region 141c, respectively, of the active layer 141 of the transistor 140 are formed.

Referring to FIG. 3, a gate electrode 144 of the thin film transistor 140 is formed on the gate insulating layer 115. The gate electrode 144 can be formed as a metal layer of molybdenum (Mo) or the like. Further, the gate electrode 144 is disposed on the gate insulating layer 115 so as to overlap the channel region 141a of the active layer 141 of the thin film transistor 140.

Referring to FIG. 3, an interlayer insulating layer 116 is disposed on the gate electrode 144 and the gate insulating layer 115. The interlayer insulating layer 116 can be made of an inorganic material such as silicon nitride (SiNx) or silicon oxide (SiOx) and formed as a single layer or a multi-layer, but is not limited thereto.

Referring to FIG. 3, the source electrode 142 and the drain electrode 143 of the thin film transistor 140 are formed on the interlayer insulating layer 116. The source electrode 142 and the drain electrode 143 are electrically connected to the active layer 141 through the contact holes formed in the gate insulating layer 115 and the interlayer insulating layer 116. The source electrode 142 and the drain electrode 143 can be made of conductive materials, and the source electrode 142 and the drain electrode 143 can be formed of the same material in the same process. However, the present disclosure is not limited thereto.

Figure 5:
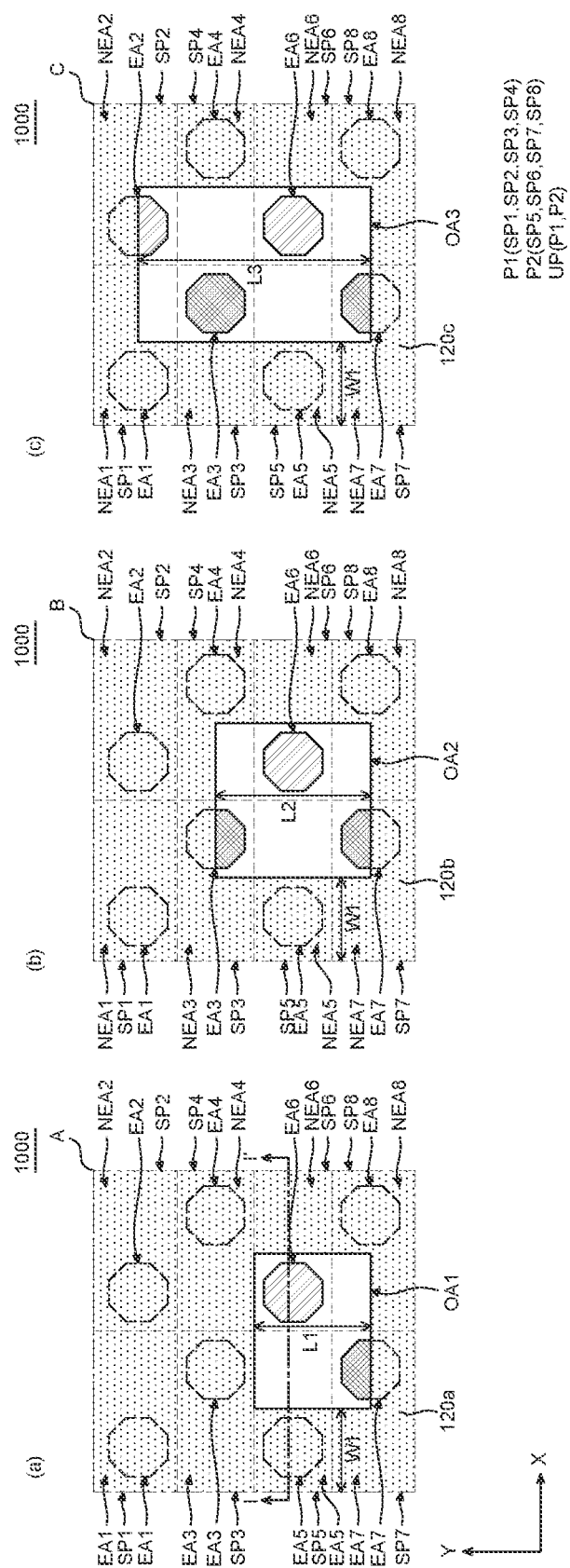
FIG. 5 illustrates a structure of a unit pixel and a mesh pattern of the foldable display device according to an exemplary embodiment of the present disclosure.

Referring to FIG. 3, a planarizing layer 117 is disposed on the source electrode 142, the drain electrode 143 and the interlayer insulating layer 116. The planarizing layer 117 is configured to flatten an upper portion of the transistor 140. The planarizing layer 117 can be formed as a single layer as shown in FIG. 5, but can also be formed as a multi-layer. The planarizing layer 117 can be made of an acryl-based organic material, but is not limited thereto. The planarizing layer 117 can include a contact hole for electrical connection between the thin film transistor 140 and an anode 151.

Further, a passivation layer can be formed between the thin film transistor 140 and the planarizing layer 117. For example, the passivation layer can be formed covering the thin film transistor 140 to protect the thin film transistor 140 against permeation of moisture and oxygen. The passivation layer can be made of an inorganic material and formed as a single layer or a multi-layer, but is not limited thereto.

Referring to FIG. 3, an organic light emitting diode 150 is disposed on the planarizing layer 117. The organic light emitting diode 150 includes the anode 151 electrically connected to the drain electrode 143 of the thin film transistor 140, an organic emission layer 152 disposed on the anode 151 and a cathode 153 formed on the organic emission layer 152. If the foldable display device 1000 is a top emission type organic light emitting display, the anode 151 can further include a reflective layer for reflecting emitted light toward the cathode 153. Furthermore, the anode 151 can include a transparent conductive layer for supplying holes to the organic emission layer 152.

Referring to FIG. 3, a bank 118 is disposed on the anode 151 and the planarizing layer 117. The bank 118 is a structure to separate pixels P adjacent to each other in the display area DA and can define a plurality of pixels P. The bank 118 can be made of an organic material, but is not limited thereto.

Referring to FIG. 3, an encapsulation layer 155 is disposed on the cathode 153. The encapsulation layer 155 minimizes degradation of the components of the display panel 100 caused by moisture or oxygen. The encapsulation layer 155 flattens an upper portion of the organic light emitting diode 150. The encapsulation layer 155 can have a multilayer structure in which an inorganic film and an organic film are laminated. For example, the encapsulation layer 155 can include at least one organic film and at least two inorganic films, and can have a multilayer structure in which inorganic films and organic films are alternately laminated. The inorganic films have excellent barrier properties against moisture or oxygen, as compared with the organic films, due to the characteristics of the material. Therefore, preferably, the organic films are disposed between the inorganic films, but the present disclosure is not limited thereto. For example, the encapsulation layer 155 can have a triple-layer structure including a first inorganic film 156, an organic film 157 and a second inorganic film 158. For example, the first inorganic film 156 and the second inorganic film 158 are each independently made of one kind or more selected from silicon nitride (SiNx), silicon oxide (SiOx), silicon oxynitride (SiON) or aluminum oxide ($Al_2O_3$), but are not limited thereto. For example, the organic film 157 can be made of one kind or more selected from epoxy resin, polyimide, polyethylene and silicon oxy-carbon (SiOC), but is not limited thereto.

Figure 4:
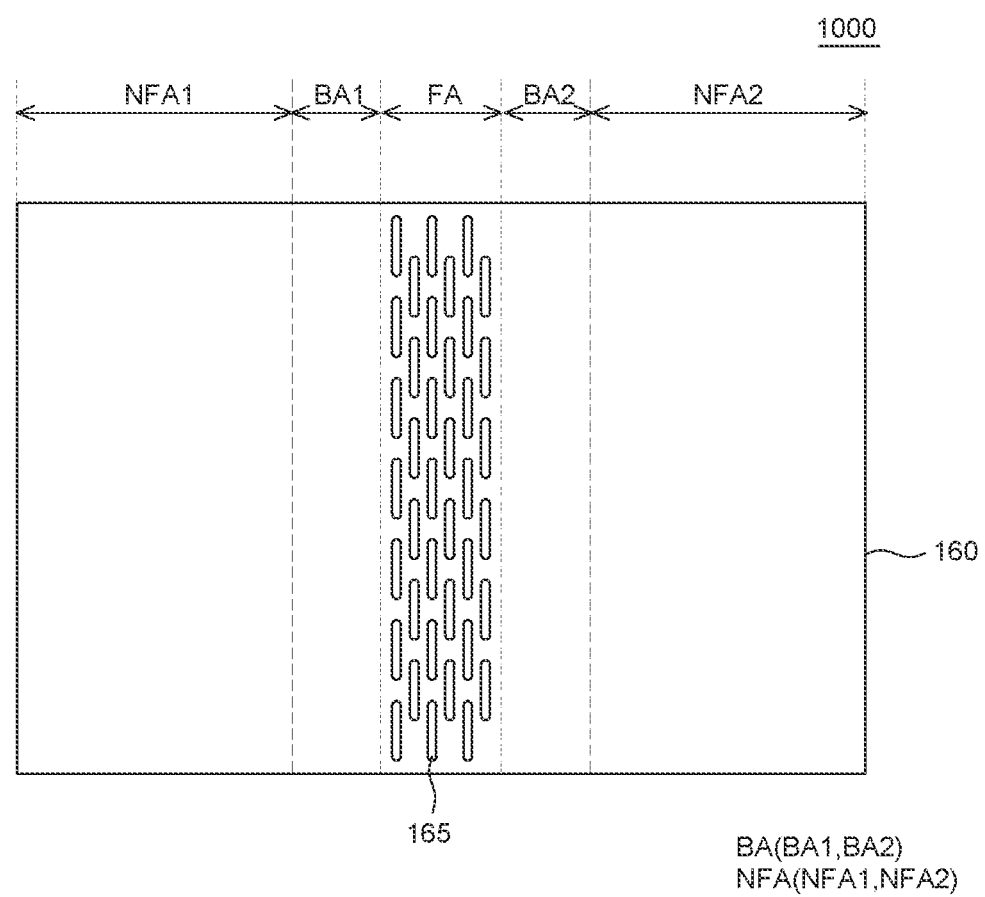
FIG. 4 is a diagram illustrating a structure of a support substrate of the foldable display device according to an exemplary embodiment of the present disclosure.

FIG. 4 is a diagram illustrating a structure of the support substrate 160 of the foldable display device 1000 according to an exemplary embodiment of the present disclosure.

The foldable display device 1000 according to an exemplary embodiment of the present disclosure includes the support substrate 160 disposed under the display panel 100. The support substrate 160 can include a plurality of opening patterns 165 formed corresponding to the folding area FA.

The opening patterns 165 facilitates folding of the support substrate 160 in the folding area and returning back to original state, and thus can improve the foldability of the foldable display device 1000.

Referring to FIG. 4, each of the opening patterns 165 formed in the folding area FA of the support substrate 160 can have an oval-like shape having a major axis along the Y-axis direction and a constant minor axis length. For example, each of the opening pattern 165 has a shape where semi-circles are respectively combined to both ends of a rectangular shape. Further, the opening patterns 165 can be spaced apart from each other at a predetermined distance.

The support substrate 160 is configured to support the display panel 100 and can be referred to as a bottom plate. The support substrate 160 can be made of a metal material such as stainless steel (SUS), SUS containing other metals, such as nickel (Ni), iron (Fe), aluminum (Al)-based or magnesium (Mg). The SUS has high restoring force and strength, and, thus, even if the support substrate 160 decreases in thickness, the support structure 180 can maintain a desired strength. Thus, the support structure 180 supports the display panel 100 and also allows a decrease in the thickness of the foldable display device 1000. Therefore, it is possible to reduce the radius of curvature of the folding area FA. However, the support substrate 160 is not limited thereto. The support substrate 160 can also be made of a polymer such as polymethylmetacrylate (PMMA), polycarbonate (PC), polyvinyl alcohol (PVA), acrylonitrile butadiene-styrene (ABS), polyethylene terephthalate (PET), silicone or polyurethane (PU).

The support substrate 160 can have a thickness of from 20 μm to 1000 μm, or from 100 μm to 200 μm. If the thickness of the support substrate 160 satisfies the above ranges, the support substrate 160 can be folded while maintaining the strength and the supporting function.

The opening patterns 165 of the support substrate 160 can be formed in various shapes or at various distances in the folding area FA. For example, each of the opening patterns 165 can be formed in a rectangular shape, a diamond shape or a circular shape.

FIG. 5 illustrates a structure of a unit pixel and a mesh pattern of the foldable display device 1000 according to an exemplary embodiment of the present disclosure.

Here, (a) of FIG. 5 is an enlarged view of an area A of the folding area FA shown in FIG. 1, (b) of FIG. 5 is an enlarged view of an area B of the second folding boundary area BA2 in the folding boundary areas BA1 and BA2 shown in FIG. 1, and (c) of FIG. 5 is an enlarged view of an area C of the second non-folding area NFA2 in the non-folding areas NFA1 and NFA2 shown in FIG. 1.

Referring to (a)-(c) of FIG. 5, the display panel 100 of the foldable display device 1000 according to an exemplary embodiment of the present disclosure includes a plurality of sub-pixels SP1, SP2, SP3, SP4, SP5, SP6, SP7 and SP8. The plurality of sub-pixels SP1, SP2, SP3, SP4, SP5, SP6, SP7 and SP8 is disposed in a matrix form.

Referring to (a)-(c) of FIG. 5, some sub-pixels SP1, SP2, SP3 and SP4 from among the plurality of sub-pixels SP1, SP2, SP3, SP4, SP5, SP6, SP7 and SP8 can form a first pixel P1. The other sub-pixels SP5, SP6, SP7 and SP8 can form a second pixel P2.

Further, the first pixel P1 and the second pixel P2 form a unit. Therefore, unit pixels UP can be disposed repeatedly inside the display area DA of the display panel 100.

Referring to (a)-(c) of FIG. 5, the first pixel P1 can include a first sub-pixel SP1, a second sub-pixel SP2, a third sub-pixel SP3 and a fourth sub-pixel SP4.

Each of the first sub-pixel SP1 and the second sub-pixel SP2 is alternately disposed in a first direction (X-axis direction). The third sub-pixel SP3 and the fourth sub-pixel SP4 are disposed adjacent to the first sub-pixel SP1 and the second sub-pixel SP2, respectively, in a second direction (Y-axis direction). Each of the third sub-pixel SP3 and the fourth sub-pixel SP4 is alternately disposed in the first direction. However, the present disclosure is not limited thereto. The layout of the sub-pixels SP1, SP2, SP3 and SP4 can be changed in various ways depending the resolution or the like.

The first sub-pixel SP1, the second sub-pixel SP2, the third sub-pixel SP3 and the fourth sub-pixel SP4 can display different colors from each other, or can display the same color depending on the design. The plurality of sub-pixels SP1, SP2, SP3 and SP4 can each independently display any one color of red, green, blue and white. For example, the first sub-pixel SP1 can display red, the second sub-pixel SP2 can display blue, and the third sub-pixel SP3 and the fourth sub-pixel SP4 can display green, but are not limited thereto.

Further, referring to (a)-(c) of FIG. 5, the second sub-pixel SP2 is disposed adjacent to the first pixel P1 in the second direction (Y-axis direction). The second pixel P2 can include a fifth sub-pixel SP5, a sixth sub-pixel SP6, a seventh sub-pixel SP7, and an eighth sub-pixel SP8.

Each of the fifth sub-pixel SP5 and the sixth sub-pixel SP6 is alternately disposed in the first direction (X-axis direction). The seventh sub-pixel SP7 and the eighth sub-pixel SP8 are disposed adjacent to the fifth sub-pixel SP5 and the sixth sub-pixel SP6, respectively, in the second direction (Y-axis direction). Each of the seventh sub-pixel SP7 and the eighth sub-pixel SP8 is alternately disposed in the first direction. However, the present disclosure is not limited thereto. The layout of the sub-pixels SP5, SP6, SP7 and SP8 can be changed in various ways depending the resolution or the like.

The fifth sub-pixel SP5, the sixth sub-pixel SP6, the seventh sub-pixel SP7 and the eighth sub-pixel SP8 can display different colors from each other, or can display the same color depending on the design. The plurality of sub-pixels SP5, SP6, SP7 and SP8 can each independently display any one color of red, green, blue and white. For example, the fifth sub-pixel SP5 can display blue, the sixth sub-pixel SP6 can display red, and the seventh sub-pixel SP7 and the eighth sub-pixel SP8 can display green, but are not limited thereto.

Referring to (a)-(c) of FIG. 5, the plurality of sub-pixels SP1, SP2, SP3, SP4, SP5, SP6, SP7 and SP8 respectively includes emission areas EA1, EA2, EA3, EA4, EA5, EA6, EA7 and EA8 where light is emitted and non-emission areas NEA1, NEA2, NEA3, NEA4, NEA5, NEA6, NEA7 and NEA8 where light is not substantially emitted due to the bank 118. In the present disclosure, exposed areas of the anodes 151 without being covered by the bank 118 are defined as the emission areas EA1, EA2, EA3, EA4, EA5, EA6, EA7 and EA8. Further, the other areas are defined as the non-emission areas NEA1, NEA2, NEA3, NEA4, NEA5, NEA6, NEA7 and NEA8.

Referring to (a)-(c) of FIG. 5, the emission areas EA1, EA2, EA3, EA4, EA5, EA6, EA7 and EA8 of the plurality of sub-pixels SP1, SP2, SP3, SP4, SP5, SP6, SP7 and SP8 are illustrated as having an octagonal shape. However, this is just an example, the shape of the emission areas EA1, EA2, EA3, EA4, EA5, EA6, EA7 and EA8 is not limited to the octagonal shape. For example, the emission areas EA1, EA2, EA3, EA4, EA5, EA6, EA7 and EA8 of the plurality of sub-pixels SP1, SP2, SP3, SP4, SP5, SP6, SP7 and SP8 can also have any polygonal shape except a circular shape, an oval shape and an octagonal shape.

Here, (a) of FIG. 5 is an enlarged view of the area A of the folding area FA shown in FIG. 1. Referring to (a) of FIG. 5, the foldable display device 1000 according to an exemplary embodiment of the present disclosure can include the plurality of first mesh patterns 120a having the first openings OA1 in the folding area FA. The first opening OA1 formed in each of the plurality of first mesh patterns 120a in the folding area FA can have a length L1 in the second direction (Y-axis direction). Further, each of the plurality of first mesh patterns 120a in the folding area FA can have a line width W1 in the first direction (X-axis direction).

Further, (b) of FIG. 5 is an enlarged view of the area B of the second folding boundary area BA2 in the folding boundary areas BA1 and BA2 shown in FIG. 1. Referring to (b) of FIG. 5, the foldable display device 1000 according to an exemplary embodiment of the present disclosure can include the plurality of second mesh patterns 120b having the second openings OA2 in the second folding boundary area BA2. The second opening OA2 formed in each of the plurality of second mesh patterns 120b in the second folding boundary area BA2 can have a length L2 in the second direction (Y-axis direction). Further, each of the plurality of second mesh patterns 120b in the second folding boundary area BA2 can have the line width W1 in the first direction (X-axis direction).

Also, (c) of FIG. 5 is an enlarged view of the area C of the second non-folding area NFA2 in the non-folding areas NFA1 and NFA2 shown in FIG. 1. Referring to (c) of FIG. 5, the foldable display device 1000 according to an exemplary embodiment of the present disclosure can include the plurality of third mesh patterns 120c having the third openings OA3 in the second non-folding area NFA2 in the non-folding areas NFA1 and NFA2. The third opening OA3 formed in each of the plurality of third mesh patterns 120c in the second non-folding area NFA2 can have a length L3 in the second direction (Y-axis direction). Further, each of the plurality of third mesh patterns 120c in the second non-folding area NFA2 can have the line width W1 in the first direction (X-axis direction).

Here, in the foldable display device 1000 according to an exemplary embodiment of the present disclosure, all the first mesh patterns 120a, the second mesh patterns 120b and the third mesh pattern 120c can have the same line width W1 in the first direction (X-axis direction).

Referring to (a)-(c) of FIG. 5, in the foldable display device 1000 according to an exemplary embodiment of the present disclosure, the openings OA1 of the mesh patterns 120a in the folding area FA can be formed smaller in size than the openings OA3 of the mesh patterns 120c in the non-folding areas NFA1 and NFA2.

More specifically, the length L1, which is the length of the opening OA1 of the mesh pattern 120a in the folding area FA in the second direction, can be smaller than the length L3, which is the length of the opening OA3 of the mesh pattern 120c in the second non-folding area NFA2 in the second direction.

Further, referring to (a)-(c) of FIG. 5, in the foldable display device 1000 according to an exemplary embodiment of the present disclosure, the opening OA1 of the mesh pattern 120a in the folding area FA can be formed smaller in size than the opening OA2 of the mesh pattern 120b in the folding boundary areas BA1 and BA2.

More specifically, the length L1, which is the length of the opening OA1 of the mesh pattern 120a in the folding area FA in the second direction, can be smaller than the length L2, which is the length of the opening OA2 of the mesh pattern 120b in the second folding boundary area BA2 in the second direction.

Further, referring to (a)-(c) of FIG. 5, in the foldable display device 1000 according to an exemplary embodiment of the present disclosure, the opening OA2 of the mesh pattern 120b in the folding boundary areas BA1 and BA2 can be formed smaller in size than the opening OA3 of the mesh pattern 120c in the non-folding areas NFA1 and NFA2.

More specifically, the length L2, which is the length of the opening OA2 of the mesh pattern 120b in the second folding boundary area BA2 in the second direction, can be smaller than the length L3, which is the length of the opening OA3 of the mesh pattern 120c in the second non-folding area NFA2 in the second direction.

For example, in the foldable display device 1000 according to an exemplary embodiment of the present disclosure, the opening OA2 of the mesh pattern 120b in the folding boundary areas BA1 and BA2 can be greater in size than the opening OA1 of the mesh pattern 120a in the folding area FA. Further, the opening OA2 of the mesh pattern 120b in the folding boundary areas BA1 and BA2 can be smaller in size than the opening OA3 of the mesh pattern 120c in the non-folding areas NFA1 and NFA2.

In the foldable display device 1000 according to an exemplary embodiment of the present disclosure, the opening OA1 of the mesh pattern 120a in the folding area FA can be formed smaller in size than the opening OA3 of the mesh pattern 120c in the non-folding areas NFA1 and NFA2. Further, the opening OA3 of the mesh pattern 120c in the non-folding areas NFA1 and NFA2 can be formed greater in size than the opening OA1 of the mesh pattern 120a in the folding area FA. Furthermore, the opening OA2 of the mesh pattern 120b in the folding boundary areas BA1 and BA2 can be formed greater in size than the opening OA1 of the mesh pattern 120a in the folding area FA. Further, the opening OA2 of the mesh pattern 120b in the folding boundary areas BA1 and BA2 can be formed smaller in size than the opening OA3 of the mesh pattern 120c in the non-folding areas NFA1 and NFA2.

For example, in the foldable display device 1000 according to an exemplary embodiment of the present disclosure, the openings OA1, OA2 and OA3 of the mesh patterns 120a, 120b and 120c increase in size from the folding area FA toward the non-folding areas NFA1 and NFA2. Thus, the mesh patterns 120a, 120b and 120c reduce the reflectivity at the pattern portion 165 formed in the folding area FA of the support substrate 160, which is a structure disposed under the display panel 100 and configured to support the display panel 100. Therefore, the mesh patterns 120a, 120b and 120c can function to minimize the user's visual recognition of the pattern portion 165. Further, the mesh patterns 120a, 120b and 120c can easily diffuse heat generated from the display panel 100 while the foldable display device 1000 is driven. Therefore, the mesh patterns 120a, 120b and 120c can function to suppress the occurrence of mura in the folding area FA.

Further, in the foldable display device 1000 according to an exemplary embodiment of the present disclosure, all the openings OA1 of the mesh patterns 120a in the folding area FA can have the same size.

Further, in the foldable display device 1000 according to an exemplary embodiment of the present disclosure, all the openings OA3 of the plurality of mesh patterns 120c in the non-folding areas NFA1 and NFA2 can have the same size.

Furthermore, in the foldable display device 1000 according to an exemplary embodiment of the present disclosure, all the openings OA2 of the plurality of mesh patterns 120b in the folding boundary areas BA1 and BA2 can have the same size.

Further, referring to (a)-(c) of FIG. 5, in the foldable display device 1000 according to an exemplary embodiment of the present disclosure, each pattern of the mesh pattern 120 can be formed corresponding in size to each of a plurality of unit pixels in the display area DA.

Specifically, one of the first mesh patterns 120a having the first openings OA1 in the folding area FA, the second mesh patterns 120b having the second openings OA2 in the first folding boundary area BA1 and the second folding boundary area BA2 and the third mesh patterns 120c having the third openings OA3 in the first non-folding area NFA1 and the second non-folding area NFA2 is formed corresponding in size to each of a plurality of unit pixels. Thus, all the patterns of the mesh pattern 120 can have the same size.

Further, referring to (a)-(c) of FIG. 5, in the foldable display device 1000 according to an exemplary embodiment of the present disclosure, the opening OA of the mesh pattern 120 can be disposed corresponding to at least two of the plurality of sub-pixels.

Further, in the folding area FA, the folding boundary areas BA1 and BA2 and the non-folding areas NFA1 and NFA2, the openings OA1, OA2 and OA3 of the plurality of mesh patterns 120a, 120b and 120c can be formed at the same position in the respective unit pixels.

More specifically, the first openings OA1 of the plurality of first mesh patterns 120a in the folding area FA can be formed at the same position in the respective unit pixels. Further, the second openings OA2 of the plurality of second mesh patterns 120b in the folding boundary areas BA1 and BA2 can be formed at the same position in the respective unit pixels. Further, the third openings OA3 of the plurality of third mesh patterns 120c in the non-folding areas NFA1 and NFA2 can be formed at the same position in the respective unit pixels.

For example, the foldable display device 1000 according to an exemplary embodiment of the present disclosure includes the mesh pattern 120 having the plurality of openings OA and made of a metal material between the flexible substrates 111 and 112. Further, the openings OA of the mesh pattern 120 increase in size from the folding area FA toward the non-folding areas NFA. Thus, the mesh pattern 120 reduces the reflectivity at the pattern portion 165 of the support substrate 160, which is a structure configured to support the display panel 100. Therefore, the mesh pattern 120 can minimize the user's visual recognition of the pattern portion 165.

Further, the mesh pattern 120 can easily diffuse heat generated from the display panel 100 while the foldable display device 1000 according to an exemplary embodiment of the present disclosure is driven. Therefore, the mesh pattern 120 can suppress the occurrence of mura in the folding area FA.

Figure 6:
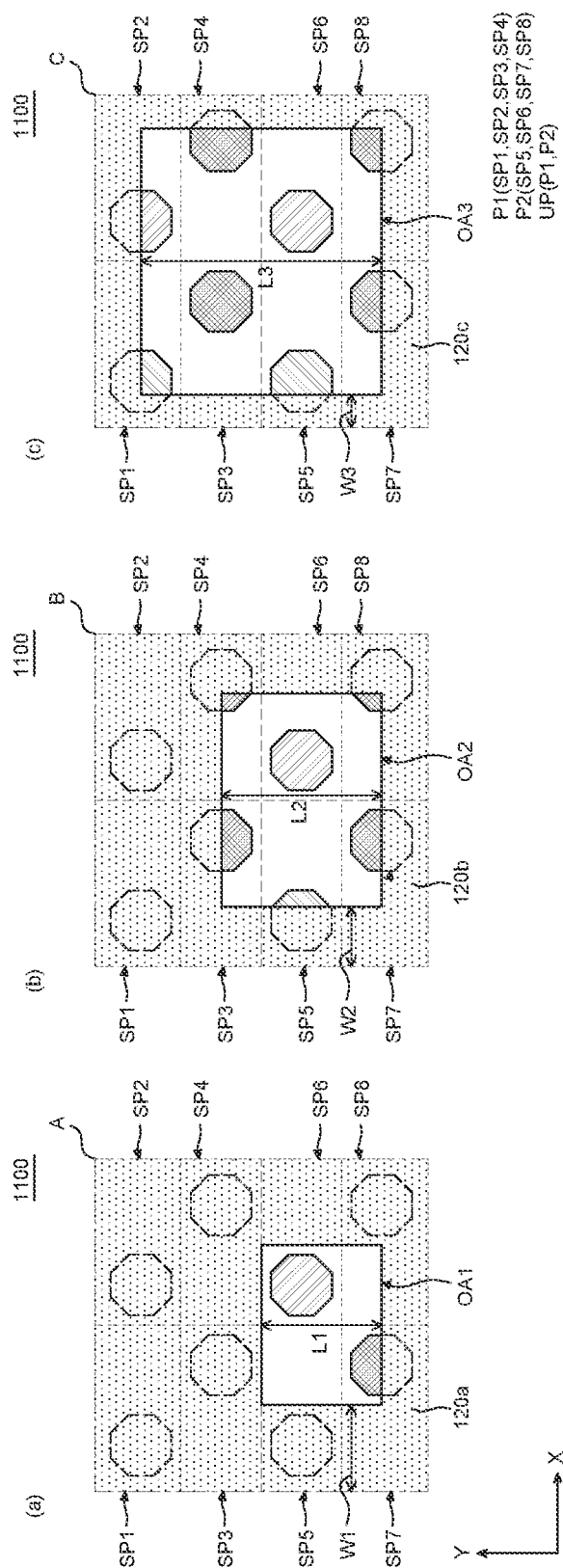
FIG. 6 illustrates a structure of a unit pixel and a mesh pattern of a foldable display device according to another exemplary embodiment of the present disclosure.

FIG. 6 illustrates a structure of a unit pixel and a mesh pattern of a foldable display device 1100 according to another exemplary embodiment of the present disclosure.

The foldable display device 1100 shown in (a)-(c) of FIG. 6 is substantially the same as the foldable display device 1000 shown in (a)-(c) of FIG. 5 except that a line width W of the wiring line of the mesh pattern 120 gradually increases from the folding area FA toward the non-folding areas NFA. Thus, repeated description will be omitted or a brief description of the same elements may be provided.

Referring to (a) of FIG. 6, the foldable display device 1100 according to another exemplary embodiment of the present disclosure can include the plurality of first mesh patterns 120a having the first openings OA1 in the folding area FA.

Further, the first opening OA1 formed in each of the plurality of first mesh patterns 120a in the folding area FA can have the length L1 in the second direction (Y-axis direction). Further, referring to (a) of FIG. 6, each of the plurality of first mesh patterns 120a in the folding area FA can have the line width W1 in the first direction (X-axis direction).

Referring to (b) of FIG. 6, the foldable display device 1100 according to another exemplary embodiment of the present disclosure can include the plurality of second mesh patterns 120b having the second openings OA2 in the second folding boundary area BA2.

Further, the second opening OA2 formed in each of the plurality of second mesh patterns 120b in the second folding boundary area BA2 can have the length L2 in the second direction (Y-axis direction). Further, referring to (b) of FIG. 6, each of the plurality of second mesh patterns 120b in the second folding boundary area BA2 can have a line width W2 in the first direction (X-axis direction).

Referring to (c) of FIG. 6, the foldable display device 1100 according to another exemplary embodiment of the present disclosure can include the plurality of third mesh patterns 120c having the third openings OA3 in the second non-folding area NFA2 in the non-folding areas NFA1 and NFA2.

Further, the third openings OA3 formed in each of the plurality of third mesh patterns 120c in the second non-folding area NFA2 can have the length L3 in the second direction (Y-axis direction). Further, referring to FIG. 6(c), each of the plurality of third mesh patterns 120c in the second non-folding area NFA2 can have a line width W3 in the first direction (X-axis direction).

In the foldable display device 1100 according to another exemplary embodiment of the present disclosure, the line width W1 of the first mesh pattern 120a can be greater than the line width W2 of the second mesh pattern 120b. Further, the line width W2 of the second mesh pattern 120b can be greater than the line width W3 of the third mesh pattern 120c.

For example, in the foldable display device 1100 according to another exemplary embodiment of the present disclosure, the line width W2 of the wiring line of the second mesh pattern 120b in the folding boundary area BA between the folding area FA and the non-folding area NFA can be smaller than the line width W1 of the wiring line of the first mesh pattern 120a in the folding area FA. Further, the line width W2 of the wiring line of the second mesh pattern 120b in the folding boundary area BA can be greater than the line width W3 of the wiring line of the mesh pattern 120c in the non-folding areas NFA1 and NFA2.

For example, referring to (a)-(c) of FIG. 6, in the foldable display device 1100 according to another exemplary embodiment of the present disclosure, as the lengths L1, L2 and L3 of the mesh patterns 120a, 120b and 120c in the second direction (Y-axis direction), i.e., the sizes of the openings OA1, OA2 and OA3 of the mesh patterns 120a, 120b and 120c, increase, the line widths W1, W2 and W3 of the mesh patterns 120a, 120b and 120c can decrease.

Figure 7:
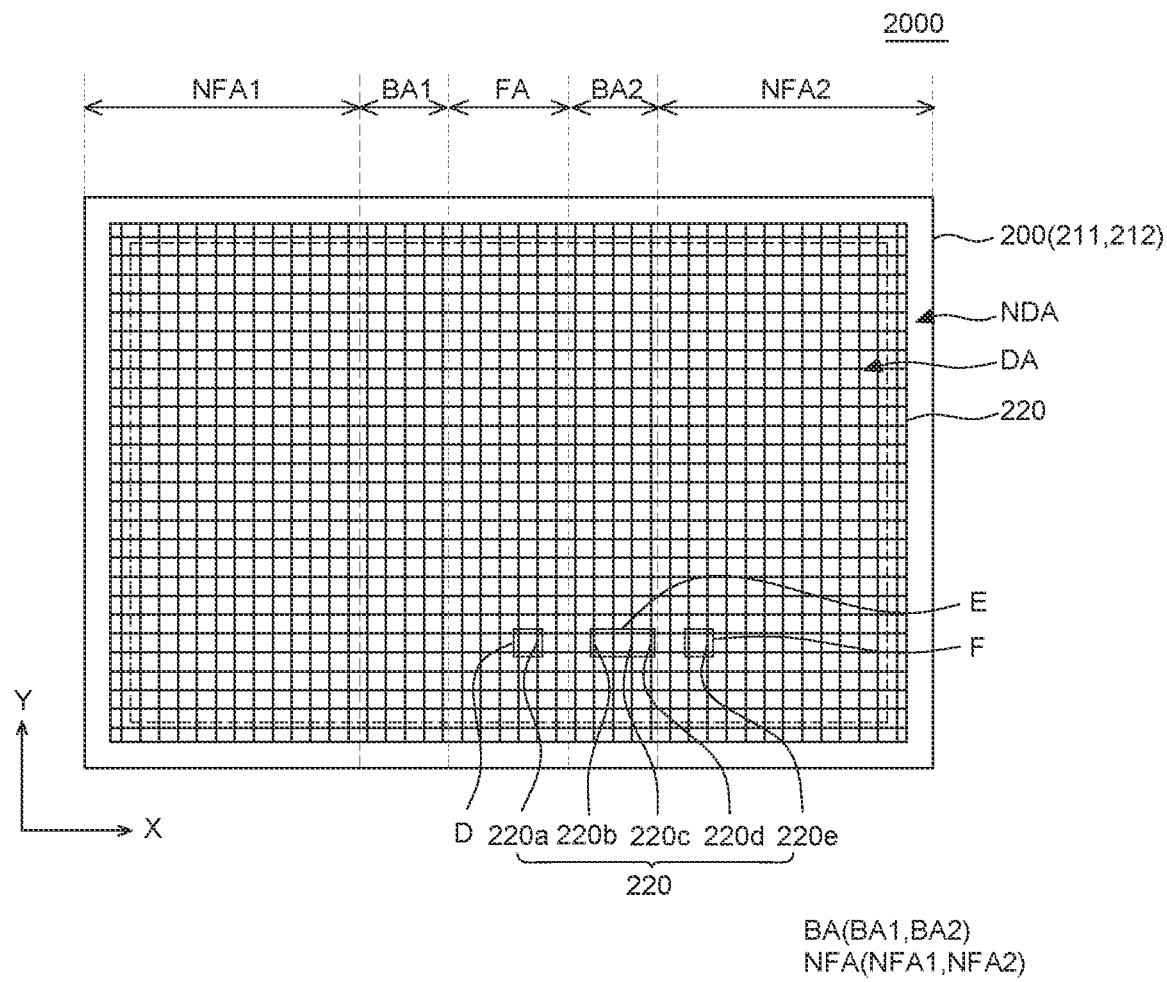
FIG. 7 is a plan view of a foldable display device according to yet another exemplary embodiment of the present disclosure.

FIG. 7 is a plan view of a foldable display device 2000 according to yet another exemplary embodiment of the present disclosure.

Figure 8A:
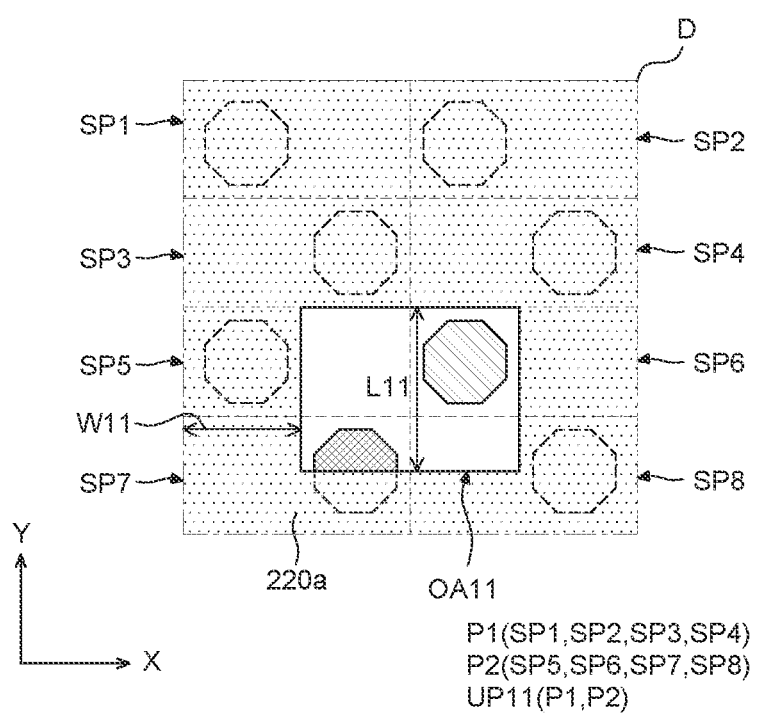
FIG. 8A through FIG. 8C illustrate a structure of a mesh pattern of the foldable display device according to yet another exemplary embodiment of the present disclosure.
Figure 8B:
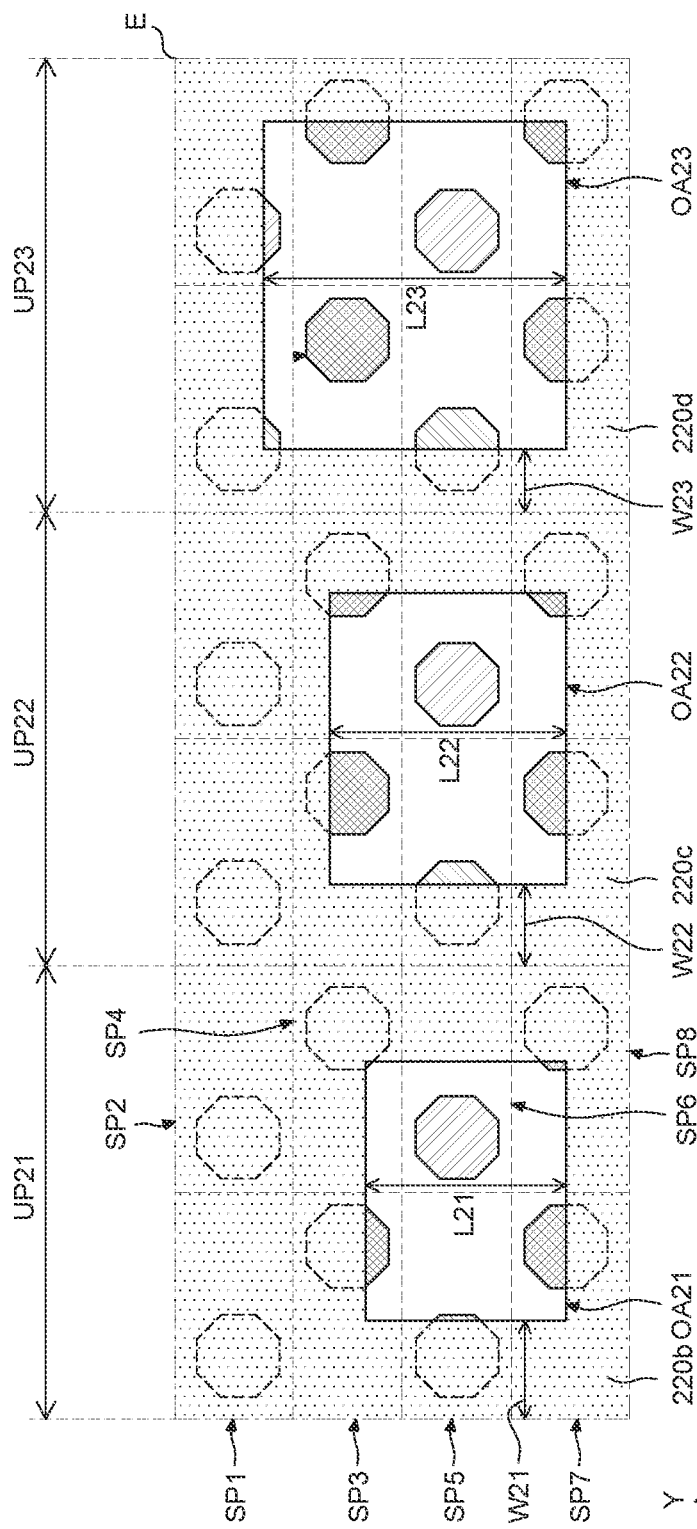
Figure 8C:
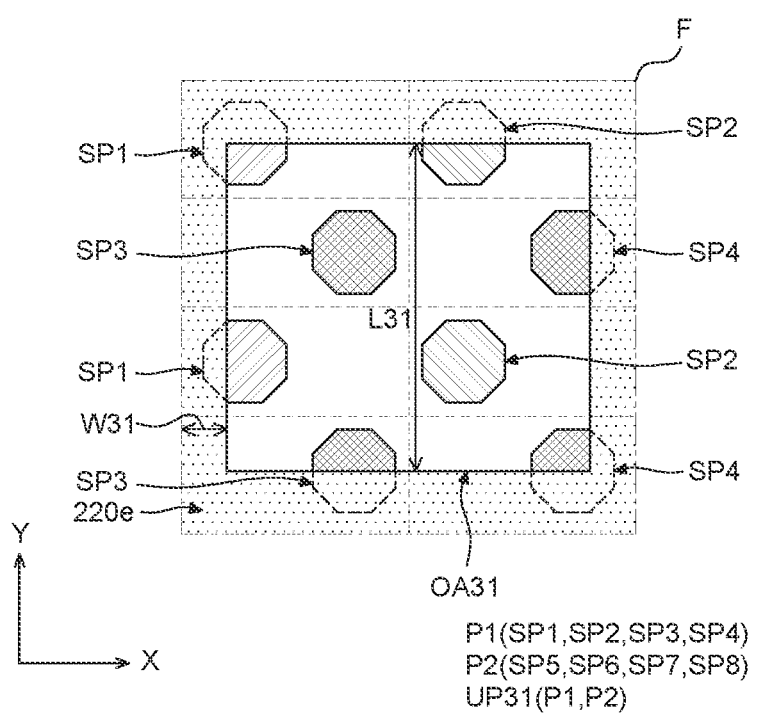

FIG. 8A through FIG. 8C illustrate a structure of a unit pixel and a mesh pattern 220 of the foldable display device 2000 according to yet another exemplary embodiment of the present disclosure.

FIG. 8A is an enlarged view of an area D of the folding area FA shown in FIG. 7. FIG. 8B is an enlarged view of an area E of the second folding boundary area BA2 shown in FIG. 7. FIG. 8C is an enlarged view of an area F of the second non-folding area NFA2 shown in FIG. 7.

The foldable display device 2000 according to yet another exemplary embodiment of the present disclosure shown in FIG. 7 and FIG. 8A through FIG. 8C is substantially the same as the foldable display device 1000 shown in FIG. 3 except that openings OA21, OA22 and OA23 of a mesh pattern 220 in the folding boundary areas BA1 and BA2 gradually increase in size from the folding area FA toward the non-folding areas NFA, i.e., as getting farther away from the folding area FA. Thus, repeated description will be omitted or a brief description of the same elements may be provided.

Referring to FIG. 7, the foldable display device 2000 according to yet another exemplary embodiment of the present disclosure can include a mesh pattern 220 having a plurality of openings OA between a first substrate 211 on which components of a foldable display panel 200 are formed and a second substrate 212.

Referring to FIG. 8A, the foldable display device 2000 according to yet another exemplary embodiment of the present disclosure can include a plurality of first mesh patterns 220a having first openings OA11 in the folding area FA.

Referring to FIG. 8B, the foldable display device 2000 according to yet another exemplary embodiment of the present disclosure can include a plurality of second mesh patterns 220b having second openings OA21, a plurality of third mesh patterns 220c having third openings OA22 and a plurality of fourth mesh patterns 220d having fourth openings OA23 in the second folding boundary area BA2, which are the folding boundary areas BA1 and BA2. The mesh pattern 220 formed in the first folding boundary area BA1 can have the openings OA identical in size to the openings OA in the second folding boundary area BA2.

Further, referring to FIG. 8C, the foldable display device 2000 according to yet another exemplary embodiment of the present disclosure can include a plurality of fifth mesh patterns 220e having fifth openings OA31 in the second non-folding area NFA2. The mesh pattern 220 formed in the first non-folding area NFA1 can have the openings OA identical in size to the openings OA in the second non-folding area NFA2.

In the foldable display device 2000 according to yet another exemplary embodiment of the present disclosure, the first openings OA11 of the first mesh patterns 220a in the folding area FA can be formed smaller in size than the fifth openings OA31 of the fifth mesh patterns 220e in the non-folding areas NFA1 and NFA2.

Further, in the foldable display device 2000 according to yet another exemplary embodiment of the present disclosure, the first openings OA11 of the first mesh patterns 220a in the folding area FA can be formed smaller in size than the second openings OA21 of the second mesh patterns 220b, the third openings OA22 of the third mesh patterns 220c and the fourth openings OA23 of the fourth mesh patterns 220d in the folding boundary areas BA1 and BA2.

Further, in the foldable display device 2000 according to yet another exemplary embodiment of the present disclosure, the second openings OA21 of the second mesh patterns 220b, the third openings OA22 of the third mesh patterns 220c and the fourth openings OA23 of the fourth mesh patterns 220d in the folding boundary areas BA1 and BA2 can be formed smaller than the fifth openings OA31 of the fifth mesh patterns 220e in the non-folding areas NFA1 and NFA2.

For example, in the foldable display device 2000 according to yet another exemplary embodiment of the present disclosure, the second openings OA21 of the second mesh patterns 220b, the third openings OA22 of the third mesh patterns 220c and the fourth openings OA23 of the fourth mesh patterns 220d in the folding boundary areas BA1 and BA2 can be greater in size than the first openings OA11 of the first mesh patterns 220a in the folding area FA. Further, the second openings OA21 of the second mesh patterns 220b, the third openings OA22 of the third mesh patterns 220c and the fourth openings OA23 of the fourth mesh patterns 220d in the folding boundary areas BA1 and BA2 can be smaller than the fifth openings OA31 of the fifth mesh patterns 220e in the non-folding areas NFA1 and NFA2.

Here, all the openings OA11 of the plurality of first mesh patterns 220a in the folding area FA can have the same size.

Further, all the openings OA31 of the plurality of fifth mesh patterns 220e in the non-folding areas NFA1 and NFA2 can have the same size.

Referring to FIG. 8B, in the foldable display device 2000 according to yet another exemplary embodiment of the present disclosure, the second openings OA21 of the second mesh patterns 220b, the third openings OA22 of the third mesh patterns 220c and the fourth openings OA23 of the fourth mesh patterns 220d in the folding boundary areas BA1 and BA2 can gradually increase in size as getting farther away from the folding area FA.

Specifically, referring to FIG. 8B, in the area E of FIG. 7 included in the second folding boundary area BA2, the second opening OA21 of the second mesh pattern 220b of a unit pixel UP21 most adjacent to the folding area FA can have a length L21. Further, the third opening OA22 of the third mesh pattern 220c of a unit pixel UP22 farther from the folding area FA than the unit pixel UP21 can have a length L22. Further, the fourth opening OA23 of the fourth mesh pattern 220d of a unit pixel UP23 farther from the folding area FA than the unit pixel UP22 can have a length L23.

For example, referring to FIG. 8B, in the second folding boundary area BA2, the length L21 of the second opening OA21 of the unit pixel U21 can be smaller than the length L22 of the third opening OA22 of the unit pixel UP22. Further, in the second folding boundary area BA2, the length L22 of the third opening OA22 of the unit pixel UP22 can be smaller than the length 23 of the fourth opening OA23 of the unit pixel UP23.

For example, in the second folding boundary area BA2, the second opening OA21 of the second mesh pattern 220b can be formed smaller than the third opening OA22 of the third mesh pattern 220c. Further, in the second folding boundary area BA2, the third opening OA22 of the third mesh pattern 220c can be formed smaller than the fourth opening OA23 of the fourth mesh pattern 220d.

In the foldable display device 2000 according to yet another exemplary embodiment of the present disclosure, the second openings OA21 of the second mesh patterns 220b, the third openings OA22 of the third mesh patterns 220c and the fourth openings OA23 of the fourth mesh patterns 220d in the folding boundary areas BA1 and BA2 gradually increase in size as getting farther away from the folding area FA. Thus, the reflectivity in the folding boundary areas BA1 and BA2 can be reduced. Therefore, it is possible to minimize the user's visual recognition of a pattern portion in the folding boundary areas BA1 and BA2.

Figure 9:
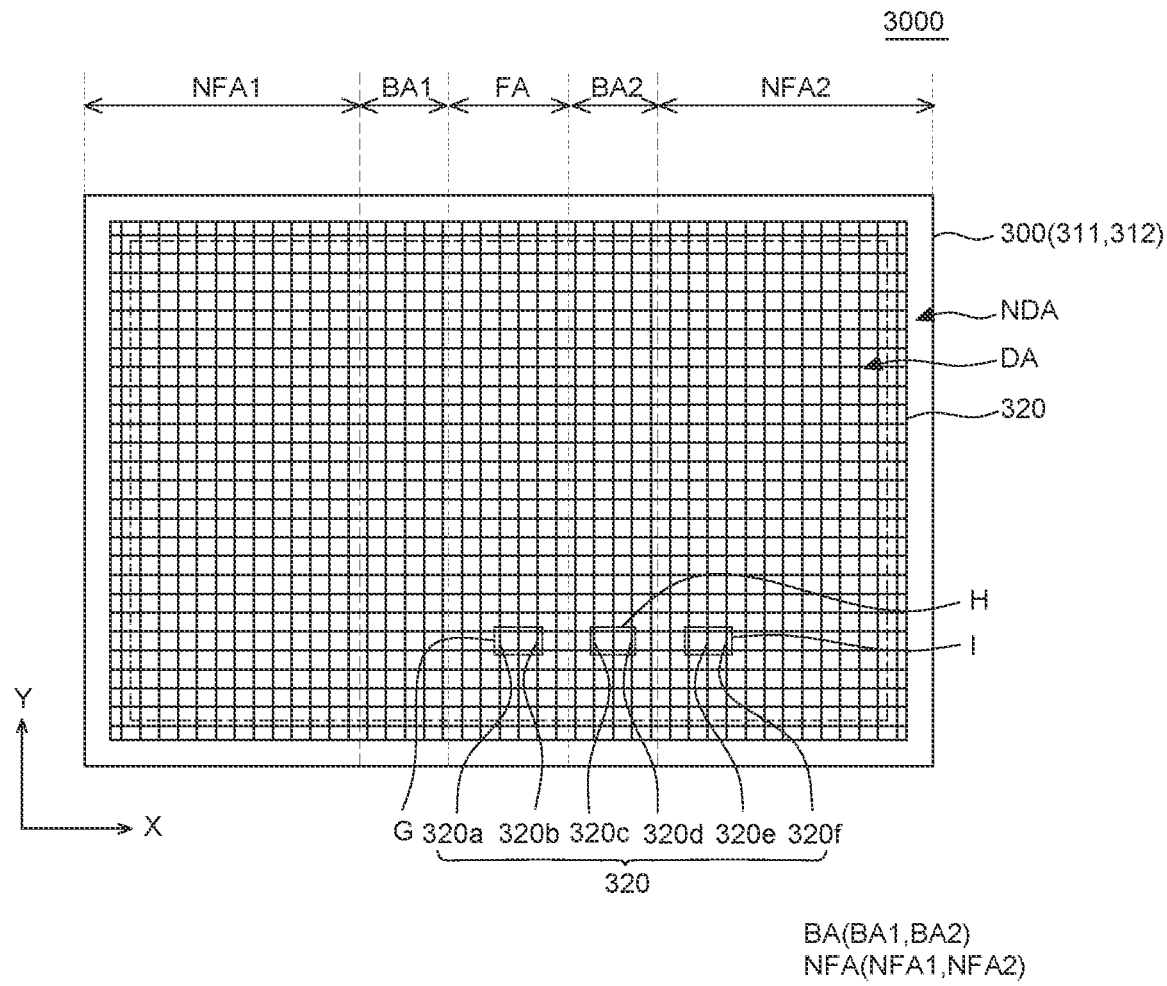
FIG. 9 is a plan view of a foldable display device according to still another exemplary embodiment of the present disclosure.

FIG. 9 is a plan view of a foldable display device 3000 according to still another exemplary embodiment of the present disclosure.

Figure 10A:
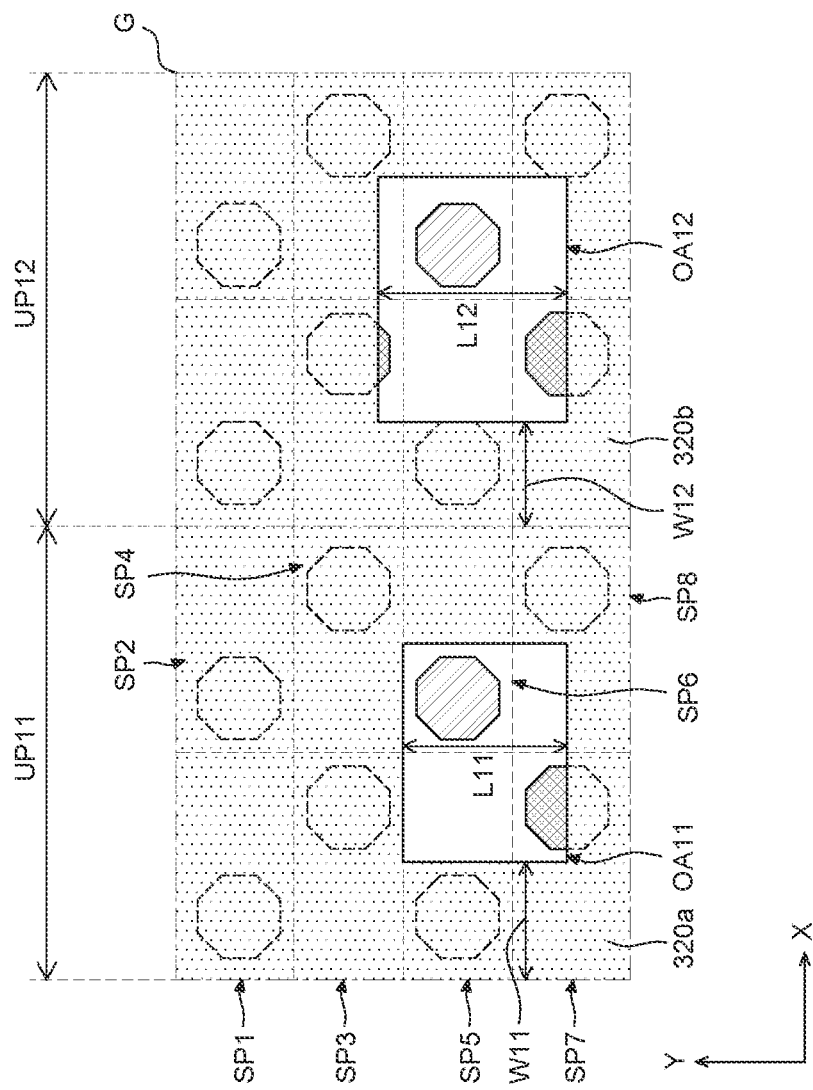
FIG. 10A through FIG. 10C illustrate a detailed structure of a mesh pattern of the foldable display device according to still another exemplary embodiment of the present disclosure.
Figure 10B:
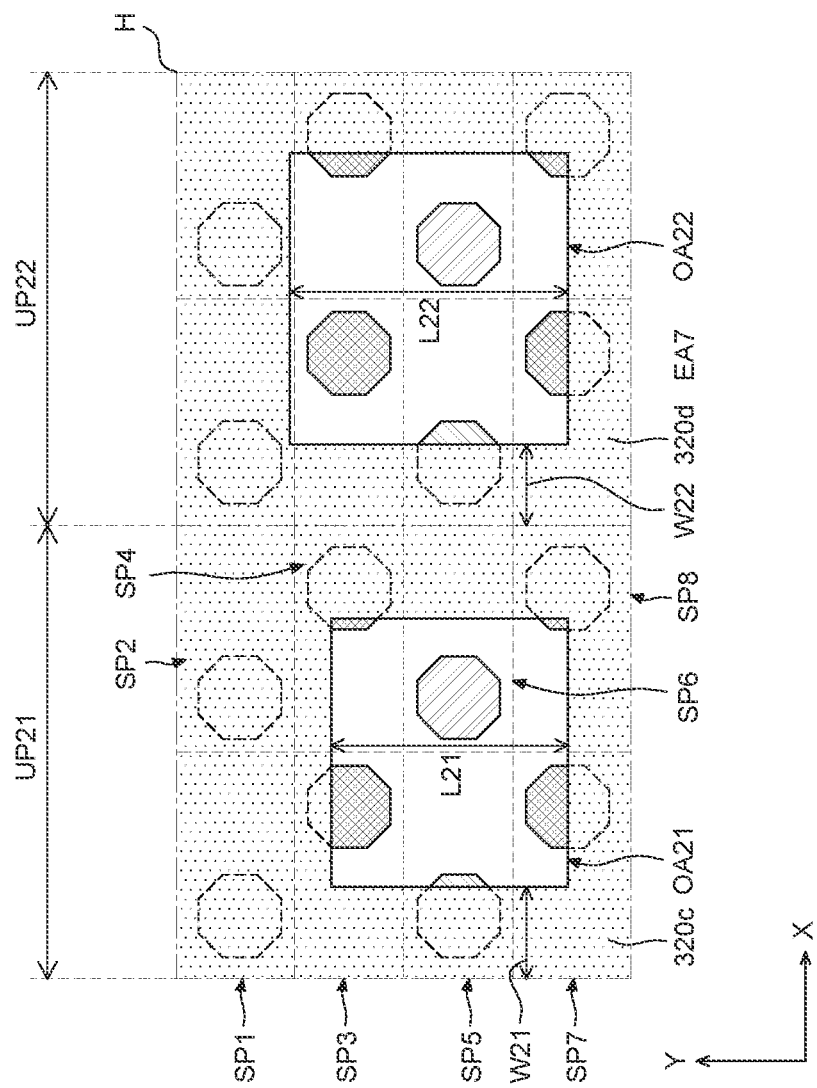
Figure 10C:
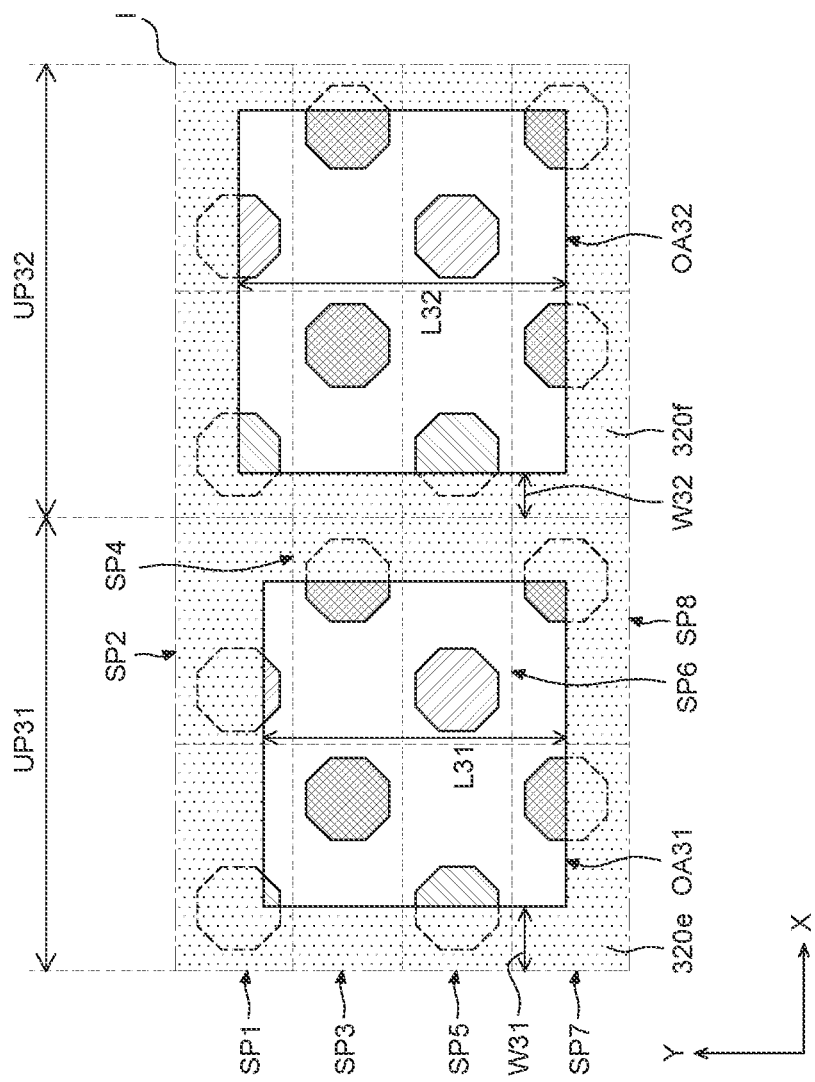

FIG. 10A through FIG. 10C illustrate a detailed structure of a unit pixel and a mesh pattern 320 of the foldable display device 3000 according to still another exemplary embodiment of the present disclosure.

FIG. 10A is an enlarged view of an area G of the folding area FA shown in FIG. 9. FIG. 10B is an enlarged view of an area H of the second folding boundary area BA2 shown in FIG. 9. FIG. 10C is an enlarged view of an area I of the second non-folding area NFA2 shown in FIG. 9.

The foldable display device 3000 according to still another exemplary embodiment of the present disclosure shown in FIG. 9 and FIG. 10A through FIG. 10C is substantially the same as the foldable display device 1000 shown in FIG. 3 except that openings OA11, OA12, OA21, OA22, OA31 and OA32 of a mesh pattern 320 in the folding area FA, the folding boundary areas BA1 and BA2 and the non-folding area NFA gradually increase in size from a central portion of the folding area FA toward the non-folding areas NFA, i.e., from the folding area FA toward the non-folding areas NFA. Thus, repeated description will be omitted or a brief description of the same elements may be provided.

Referring to FIG. 10A, in the foldable display device 3000 according to still another exemplary embodiment of the present disclosure, the folding area FA can include a first mesh pattern 320a having the first opening OA11 corresponding to a first unit pixel UP11. Further, the folding area FA can include a second mesh pattern 320b having the second opening OA12 corresponding to a second unit pixel UP12.

The first opening OA11 of the first mesh pattern 320a can have a length L11 in the second direction (Y-axis direction). Further, the first mesh pattern 320a can have a line width W11 in the first direction (X-axis direction).

The second opening OA12 of the second mesh pattern 320b can have a length L12 in the second direction (Y-axis direction). Further, the second mesh pattern 320b can have a line width W12 in the first direction (X-axis direction).

Referring to FIG. 10B, in the foldable display device 3000 according to still another exemplary embodiment of the present disclosure, the second folding boundary area BA2 can include a third mesh pattern 320c having the third opening OA21 corresponding to a third unit pixel UP21. Further, the second folding boundary area BA2 can include a fourth mesh pattern 320d having the fourth opening OA22 corresponding to a fourth unit pixel UP22.

The third opening OA21 of the third mesh pattern 320c can have a length L21 in the second direction (Y-axis direction). Further, the third mesh pattern 320c can have a line width W21 in the first direction (X-axis direction).

The fourth opening OA22 of the fourth mesh pattern 320d can have a length L22 in the second direction (Y-axis direction). Further, the fourth mesh pattern 320d can have a line width W22 in the first direction (X-axis direction).

Referring to FIG. 10C, in the foldable display device 3000 according to still another exemplary embodiment of the present disclosure, the second non-folding area NFA2 can include a fifth mesh pattern 320e having the fifth opening OA31 corresponding to a fifth unit pixel UP31. Further, the second non-folding area NFA2 can include a sixth mesh pattern 320f having the sixth opening OA32 corresponding to a sixth unit pixel UP32.

The fifth opening OA31 of the fifth mesh pattern 320e can have a length L31 in the second direction (Y-axis direction). Further, the fifth mesh pattern 320e can have a line width W31 in the first direction (X-axis direction).

The sixth opening OA32 of the sixth mesh pattern 320f can have a length L32 in the second direction (Y-axis direction). Further, the sixth mesh pattern 320f can have a line width W32 in the first direction (X-axis direction).

Referring to FIG. 10A through FIG. 10C, the length L11 of the first opening OA11 of the first mesh pattern 320a and the length L12 of the second opening OA12 of the second mesh pattern 320b in the folding area FA can be smaller than the length L21 of the third opening OA21 of the third mesh pattern 320c and the length L22 of the fourth opening OA22 of the fourth mesh pattern 320d in the second folding boundary area BA2.

Further, the length L21 of the third opening OA21 of the third mesh pattern 320c and the length L22 of the fourth opening OA22 of the fourth mesh pattern 320d in the second folding boundary area BA2 can be smaller than the length L31 of the fifth opening OA31 of the fifth mesh pattern 320e and the length L32 of the sixth opening OA32 of the sixth mesh pattern 320f in the second non-folding area NFA2.

Further, referring to FIG. 10A, in the folding area FA, the length L11 of the first opening OA11 of the first mesh pattern 320a can be smaller than the length L12 of the second opening OA12 of the second mesh pattern 320b. Further, the line width W11 of the first mesh pattern 320a can be greater than the line width W12 of the second mesh pattern 320b. For example, the openings OA of the mesh pattern 320 in the folding area FA can gradually increase in size from a central portion of the folding area FA toward the non-folding areas NFA. Further, a line width W of the mesh pattern 320 can gradually decrease from the central portion of the folding area FA toward the non-folding areas NFA.

Referring to FIG. 10B, in the second folding boundary area BA2, the length L21 of the third opening OA21 of the third mesh pattern 320c can be smaller than the length L22 of the fourth opening OA22 of the fourth mesh pattern 320d. Further, the line width W21 of the third mesh pattern 320c can be greater than the line width W22 of the fourth mesh pattern 320d. For example, the openings OA of the mesh pattern 320 in the second folding boundary area BA2 can gradually increase in size from the folding area FA toward the non-folding areas NFA. Further, the line width W of the mesh pattern 320 can gradually decrease from the folding area FA toward the non-folding areas NFA.

Referring to FIG. 10C, in the second non-folding area NFA2, the length L31 of the fifth opening OA31 of the fifth mesh pattern 320e can be smaller than the length L32 of the sixth opening OA32 of the sixth mesh pattern 320f. Further, the line width W31 of the fifth mesh pattern 320e can be greater than the line width W32 of the sixth mesh pattern 320f. For example, the openings OA of the mesh pattern 320 in the second non-folding area NFA2 can gradually increase in size from the folding area FA toward the non-folding areas NFA. Further, the line width W of the mesh pattern 320 can gradually decrease from the folding area FA toward the non-folding areas NFA.

In the foldable display device 3000 according to still another exemplary embodiment of the present disclosure, the openings OA11, OA12, OA21, OA22, OA31 and OA32 of the mesh pattern 320 in the folding area FA, the folding boundary areas BA1 and BA2 and the non-folding area NFA gradually increase in size from the central portion of the folding area FA toward the non-folding areas NFA, i.e., from the folding area FA toward the non-folding areas NFA.

Further, the line width W of the mesh pattern 320 gradually decreases from the folding area FA toward the non-folding areas NFA. Thus, the reflectivity at the pattern portion of the support substrate 160 can be reduced. Therefore, it is possible to minimize the user's visual recognition of the pattern portion 165. Further, heat generated from the display panel 100 during driving can be easily diffused. Therefore, it is possible to suppress the occurrence of mura in the folding area FA.

Figure 11:
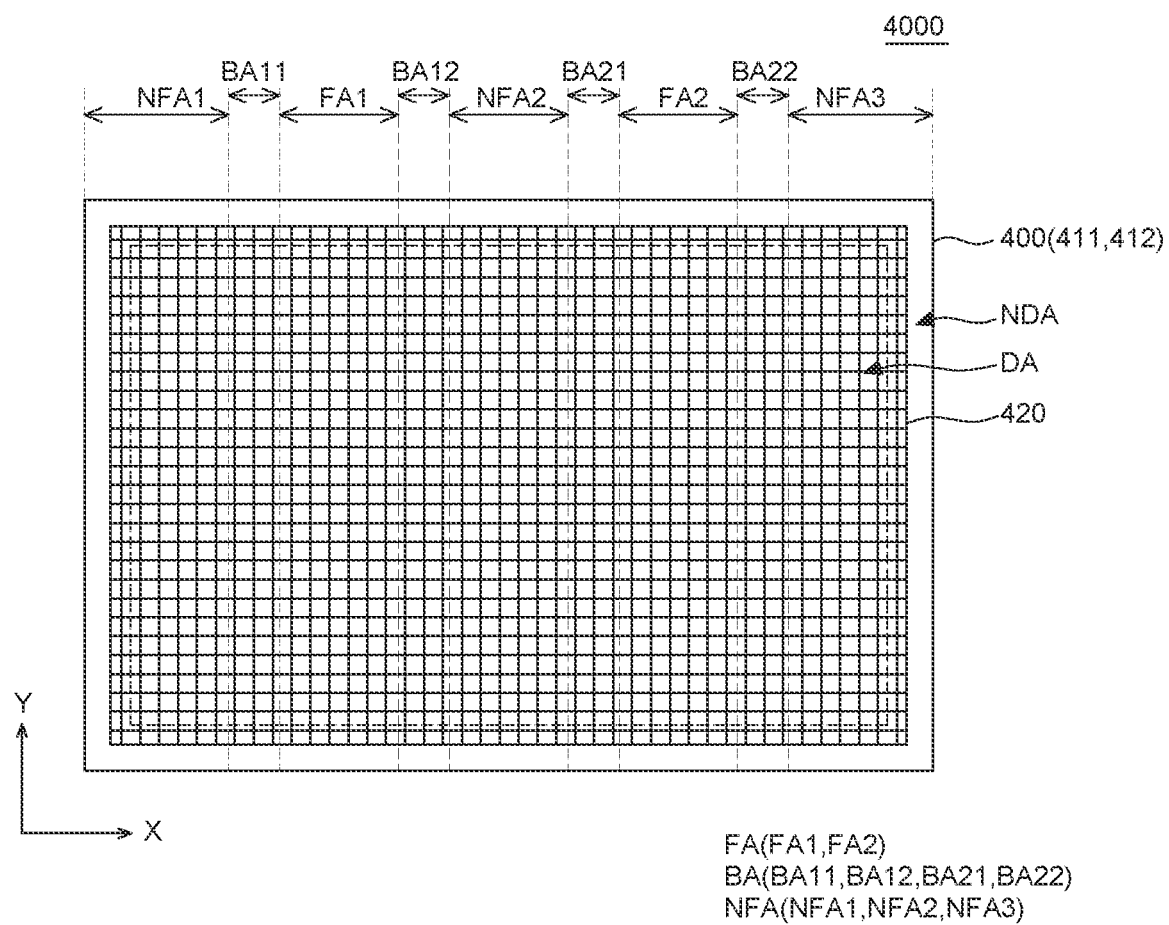
FIG. 11 is a plan view of a foldable display device according to still another exemplary embodiment of the present disclosure.

FIG. 11 is a plan view of a foldable display device 4000 according to still another exemplary embodiment of the present disclosure.

Figure 12:
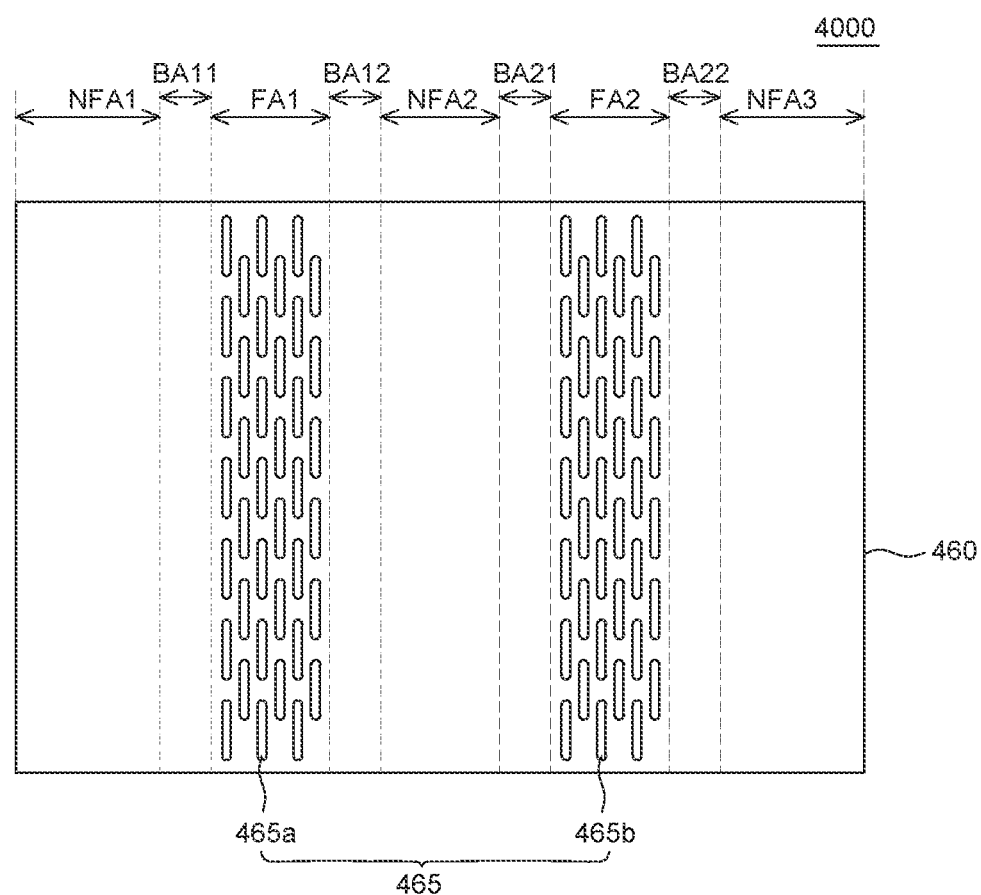
FIG. 12 is a diagram illustrating a structure of a support substrate of the foldable display device according to still another exemplary embodiment of the present disclosure.
Figure 13:
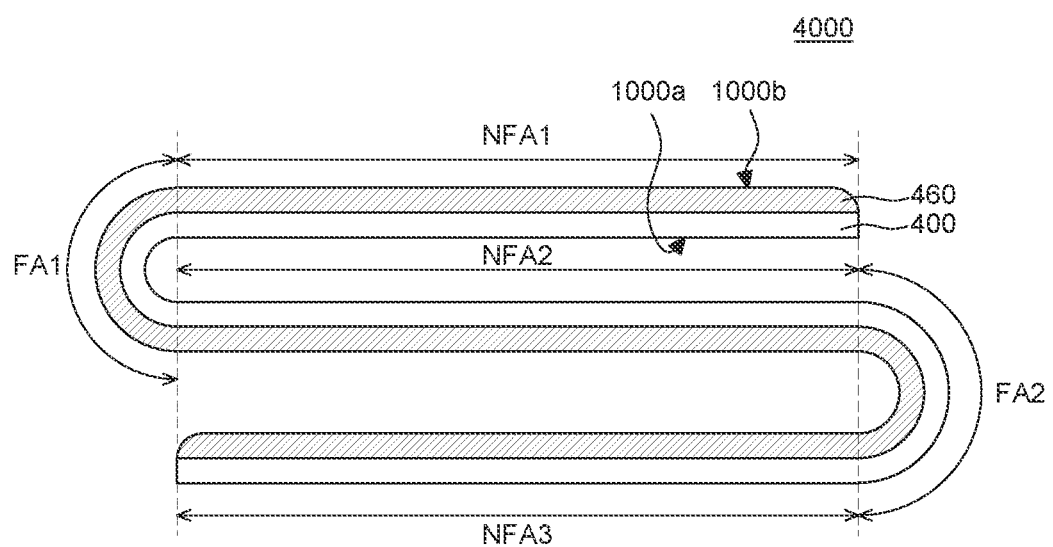
FIG. 13 is a cross-sectional view of the foldable display device when folded according to still another exemplary embodiment of the present disclosure.

The foldable display device 4000 according to still another exemplary embodiment of the present disclosure shown in FIG. 11 through FIG. 13 is substantially the same as the foldable display device 1000 shown in FIG. 3 except that the folding area FA includes a first folding area FA1 and a second folding area FA2 spaced apart from the first folding area FA1. Thus, repeated description will be omitted.

Referring to FIG. 11, the foldable display device 4000 according to still another exemplary embodiment of the present disclosure includes at least one folding area FA1 and FA2 and two or more non-folding areas NFA1, NFA2 and NFA3. The folding areas FA1 and FA2 refer to folded areas when the foldable display device 4000 is folded. The foldable display device 4000 can be folded with a specific radius of curvature around a folding axis. The non-folding areas NFA1, NFA2 and NFA3 refer to non-folded areas when the foldable display device 4000 is folded. For example, the non-folding areas NFA1, NFA2 and NFA3 maintain a flat state when the foldable display device 4000 is folded. The non-folding areas NFA1, NFA2 and NFA3 can be located on one side or both sides of the folding areas FA1 and FA2. For example, if folding axes of the folding areas FA1 and FA2 are formed in the Y-axis direction, the non-folding areas NFA1, NFA2 and NFA3 are defined as extending from the folding areas FA1 and FA2 in the X-axis direction perpendicular to the folding axes.

The foldable display device 4000 according to still another exemplary embodiment of the present disclosure includes a first folding area FA1, a second folding area FA2, the first non-folding area NFA1, the second non-folding area NFA2 and a third non-folding area NFA3. The first folding area FA1 can be disposed between the first non-folding area NFA1 and the second non-folding area NFA2. Further, the second folding area FA2 can be disposed between the second non-folding area NFA2 and the third non-folding area NFA3.

Further, a first folding boundary area BA11 can be disposed between the first non-folding area NFA1 and the first folding area FA1. Further, a second folding boundary area BA12 can be disposed between the first folding area FA1 and the second non-folding area NFA2. Furthermore, a third folding boundary area BA21 can be disposed between the second non-folding area NFA2 and the second folding area FA2. Moreover, a fourth folding boundary area BA22 can be disposed between the second folding area FA2 and the third non-folding area NFA3.

In the foldable display device 4000 according to still another exemplary embodiment of the present disclosure, the folding area FA includes the first folding area FA1 and the second folding area FA2 spaced apart from the first folding area FA1. The first folding area FA1 can be an in-folding area and the second folding area FA2 can be an out-folding area.

In the foldable display device 4000 according to still another exemplary embodiment of the present disclosure, openings OA of a mesh pattern 420 in the first folding area FA1 and the second folding area FA2 can be formed smaller in size than openings OA3 of the mesh pattern 420 in the non-folding areas NFA1, NFA2 and NFA3.

Further, in the foldable display device 4000 according to still another exemplary embodiment of the present disclosure, the openings OA of the mesh pattern 420 in the first folding area FA1 and the second folding area FA2 can be formed smaller in size than the openings OA of the mesh pattern 420 in the folding boundary areas BA11, BA12, BA21 and BA22.

Further, in the foldable display device 4000 according to still another exemplary embodiment of the present disclosure, the openings OA of the mesh pattern 420 in the folding boundary areas BA11, BA12, BA21 and BA22 can be formed smaller in size than openings OA3 of the mesh pattern 420 in the non-folding areas NFA1, NFA2 and NFA3.

Here, in the foldable display device 4000 according to still another exemplary embodiment of the present disclosure, the openings OA of the mesh pattern 420 in the first folding area FA1 can be identical in size to the openings OA of the mesh pattern 420 in the second folding area FA2.

For example, in the foldable display device 4000 according to still another exemplary embodiment of the present disclosure, the openings OA of the mesh pattern 420 in the folding boundary areas BA11, BA12, BA21 and BA22 can be greater in size than the openings OA of the mesh pattern 420 in the folding areas FA1 and FA2. Further, the openings OA of the mesh pattern 420 in the folding boundary areas BA11, BA12, BA21 and BA22 can be smaller in size than the openings OA of the mesh pattern 420 in the non-folding areas NFA1, NFA2 and NFA3.

FIG. 12 is a diagram illustrating a structure of a support substrate 460 of the foldable display device 4000 according to still another exemplary embodiment of the present disclosure.

Referring to FIG. 12, the foldable display device 4000 according to still another exemplary embodiment of the present disclosure includes a support substrate 460 disposed under a display panel 400. The support substrate 460 can include a plurality of opening patterns 465 formed in the folding areas FA1 and FA2.

Referring to FIG. 12, each of a first opening pattern 465a formed in the first folding area FA1 of the support substrate 460 and a second opening pattern 465b formed in the second folding area FA2 can have an oval-like shape having a major axis along the Y-axis direction and a constant minor axis length. For example, each of the first opening pattern 465a and the second opening pattern 465b has a shape where semi-circles are respectively combined to both ends of a rectangular shape. Further, the first opening pattern 465a and the second opening pattern 465b can be spaced apart from each other at a predetermined distance.

In the foldable display device 4000 according to still another exemplary embodiment of the present disclosure, the first opening pattern 465a formed in the first folding area FA1 of the support substrate 460 can be identical in size to the second opening pattern 465b formed in the second folding area FA2. Alternatively, the first opening pattern 465a formed in the first folding area FA1 can be different in size from the second opening pattern 465b formed in the second folding area FA2. Specifically, the first opening pattern 465a formed in the first folding area FA1 can have a longer minor axis length than the second opening pattern 465b formed in the second folding area FA2.

For example, if the first folding area FA1 has a smaller radius of curvature than the second folding area FA2, the first opening pattern 465a in the first folding area FA1 can have a longer minor axis length in a folding direction (X-axis direction) than the second opening pattern 465b in the second folding area FA2 in order for the first folding area FA1 to be more easily folded.

Further, in order for the first folding area FA1 to be more easily folded, a space between the first opening patterns 465a in the first folding area FA1 can be narrower than a space between the second opening patterns 465b in the second folding area FA2.

Further, the sizes of the opening patterns 465a and 465b in each of the folding areas FA1 and FA2 can be adjusted so that the radius of curvature can increase at the edges of the folding areas FA1 and FA2. Further, stress concentrated at the folding areas FA1 and FA2 can be reduced.

FIG. 13 is a cross-sectional view of the foldable display device 4000 when folded according to still another exemplary embodiment of the present disclosure.

Referring to FIG. 13, when the foldable display device 4000 according to still another exemplary embodiment of the present disclosure is folded, the folding areas FA1 and FA2 are folded around folding axes, respectively. Further, the folding areas FA1 and FA2 form a part of a circle or an oval. Here, the radius of curvature of the folding areas FA1 and FA2 refers to the radius of the circle or the oval formed by the folding areas FA1 and FA2. When the folding areas FA1 and FA2 are folded around the folding axes, respectively, the non-folding areas NFA1, NFA2 and NFA3 can overlap each other.

In the foldable display device 4000 according to still another exemplary embodiment of the present disclosure shown in FIG. 13, a top surface where an image is displayed is defined as a display surface 1000a, and a bottom surface of the foldable display device 4000 opposite to the display surface 1000a is defined as a rear surface 1000b. Herein, the folding areas FA1 and FA2 can be folded in an out-folding type in which the display surface 1000a of the foldable display device 4000 is folded to be exposed to the outside. Alternatively, the folding areas FA1 and FA2 can be folded in an in-folding type in which the display surface 1000a of the foldable display device 4000 is folded to face each other.

Referring to FIG. 13, the first folding area FA1 can be folded inwards so that the display surface 1000a in the first non-folding area NFA1 and the display surface 1000a in the second non-folding area NFA2 can be folded to face each other. Further, the second folding area FA2 can be folded outwards so that the rear surface 1000b in the third non-folding area NFA3 and the rear surface 1000b in the second non-folding area NFA2 can be folded to face each other. Further, when the first folding area FA1 and the second folding area FA2 are folded, the first folding area FA1 can have a smaller radius of curvature than the second folding area FA2.

A foldable display device according to an exemplary embodiment of the present disclosure includes a mesh pattern made of metal and having the plurality of openings between flexible substrates. The openings of the mesh pattern increase in size from a folding area toward a non-folding area. Thus, the reflectivity at a pattern portion of structure that supports a display panel can be reduced. Therefore, it is possible to minimize the user's visual recognition of the pattern portion.

Further, heat generated from the display panel while the foldable display device according to an exemplary embodiment of the present disclosure is driven can be easily diffused. Therefore, it is possible to suppress the occurrence of mura in the folding area.

The exemplary embodiments of the present disclosure can also be described as follows.

According to an aspect of the present disclosure, there is provided a foldable display device. The foldable display device includes a display area having a plurality of unit pixels and a non-display area surrounding the display area, and a folding area defined in the display area and the non-display area, and non-folding areas on both sides of the folding area, comprising a first substrate, a second substrate corresponding to the first substrate and including the plurality of unit pixels, a thin film transistor disposed on the second substrate, an organic light emitting diode disposed on the thin film transistor, and a mesh pattern disposed between the first substrate and the second substrate and having a plurality of openings, wherein openings of the mesh pattern in the folding area are smaller in size than openings of the mesh pattern in the non-folding areas.

The foldable display device can further comprise folding boundary areas between the folding area and the non-folding areas, wherein the openings of the mesh pattern in the folding area are smaller in size than openings of the mesh pattern in the folding boundary areas.

The openings of the mesh pattern in the folding boundary areas can be smaller in size than the openings of the mesh pattern in the non-folding areas.

The openings of the mesh pattern can gradually increase in size from the folding area toward the non-folding areas.

A pattern of the mesh pattern can be disposed corresponding to the size of each of the plurality of unit pixels.

Each of the plurality of unit pixels can include a plurality of sub-pixels, and an opening of the mesh pattern can be disposed corresponding to at least two of the sub-pixels.

All the openings of the mesh pattern in the folding area can have the same size.

All the openings of the mesh pattern in the non-folding areas can have the same size.

The mesh pattern can be greater in size than the display area and smaller in size than the first substrate.

Openings of the mesh pattern in the non-display area can be identical in size to openings of the mesh pattern in the adjacent display area.

The folding area can include a first folding area and a second folding area spaced apart from the first folding area, and the first folding area can be an in-folding area and the second folding area is an out-folding area.

According to another aspect of the present disclosure, there is provided a foldable display device. The foldable display device that includes a folding area and a non-folding area, comprises a support substrate having an opening pattern corresponding to the folding area, a first substrate disposed on the support substrate, a second substrate disposed on the first substrate and including a thin film transistor and an organic light emitting diode, and a mesh pattern disposed between the first substrate and the second substrate and having a plurality of openings, wherein a line width of the mesh pattern in a folding boundary area between the folding area and the non-folding area is smaller than a line width of the wiring line of the mesh pattern in the folding area and greater than a line width of the wiring line of the mesh pattern in the non-folding area.

The folding boundary area can be disposed corresponding to an edge area of the opening pattern of the support substrate.

Openings of the mesh pattern in the folding boundary area can be greater in size than openings of the mesh pattern in the folding area and smaller in size than openings of the mesh pattern in the non-folding area.

All the openings of the mesh pattern in the folding boundary area can have the same size.

The foldable display device further comprises an insulating layer between the first substrate and the second substrate, wherein the insulating layer fully covers the mesh pattern.

Openings of the mesh pattern in the folding boundary area can gradually increase in size as getting farther away from the folding area.

According to yet another aspect of the present disclosure, there is provided a foldable display device. The foldable display device further comprises a back plate between the support substrate and the first substrate, wherein the back plate is made of a transparent material.

The folding area can include a first folding area and a second folding area spaced apart from the first folding area, and the first folding area can be an in-folding area and the second folding area is an out-folding area.

Openings of the mesh pattern in the first folding area can be identical in size to openings of the mesh pattern in the second folding area.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A foldable display device that includes a display area having a plurality of unit pixels and a non-display area surrounding the display area, and a folding area defined in the display area and the non-display area, and non-folding areas on sides of the folding area, the foldable display device comprising:
    a first substrate;
    a second substrate corresponding to the first substrate and including the plurality of unit pixels;
    a thin film transistor disposed on the second substrate;
    an organic light emitting diode disposed on the thin film transistor; and
    a mesh pattern disposed between the first substrate and the second substrate, and having a plurality of openings,
    wherein openings of the mesh pattern in the folding area are smaller in size than openings of the mesh pattern in the non-folding areas.

2. The foldable display device according to claim 1, further comprising:
    folding boundary areas between the folding area and the non-folding areas,
    wherein the openings of the mesh pattern in the folding area are smaller in size than openings of the mesh pattern in the folding boundary areas.

3. The foldable display device according to claim 2, wherein the openings of the mesh pattern in the folding boundary areas are smaller in size than the openings of the mesh pattern in the non-folding areas.

4. The foldable display device according to claim 1, wherein the openings of the mesh pattern gradually increase in size from the folding area toward the non-folding areas.

5. The foldable display device according to claim 1, wherein a pattern of the mesh pattern is disposed to correspond to the size of each of the plurality of unit pixels.

6. The foldable display device according to claim 1, wherein each of the plurality of unit pixels includes a plurality of sub-pixels, and
    an opening of the mesh pattern is disposed to correspond to at least two of the sub-pixels.

7. The foldable display device according to claim 1, wherein all the openings of the mesh pattern in the folding area have a same size.

8. The foldable display device according to claim 1, wherein all the openings of the mesh pattern in the non-folding areas have a same size.

9. The foldable display device according to claim 1, wherein the mesh pattern is greater in size than the display area, and is smaller in size than the first substrate.

10. The foldable display device according to claim 1, wherein openings of the mesh pattern in the non-display area are identical in size to openings of the mesh pattern in the adjacent display area.

11. The foldable display device according to claim 1, wherein the folding area includes a first folding area and a second folding area spaced apart from the first folding area, and
    the first folding area is an in-folding area and the second folding area is an out-folding area.

12. A foldable display device that includes a folding area and a non-folding area, the foldable display device comprising:
    a support substrate having an opening pattern corresponding to the folding area;
    a first substrate disposed on the support substrate;
    a second substrate disposed on the first substrate, and including a thin film transistor and an organic light emitting diode; and
    a mesh pattern disposed between the first substrate and the second substrate, and having a plurality of openings,
    wherein a line width of the mesh pattern in a folding boundary area between the folding area and the non-folding area is smaller than a line width of the wiring line of the mesh pattern in the folding area, and is greater than a line width of the wiring line of the mesh pattern in the non-folding area.

13. The foldable display device according to claim 12, wherein the folding boundary area is disposed to correspond to an edge area of the opening pattern of the support substrate.

14. The foldable display device according to claim 12, wherein openings of the mesh pattern in the folding boundary area are greater in size than openings of the mesh pattern in the folding area, and are smaller in size than openings of the mesh pattern in the non-folding area.

15. The foldable display device according to claim 14, wherein all the openings of the mesh pattern in the folding boundary area have a same size.

16. The foldable display device according to claim 12, further comprising:

an insulating layer between the first substrate and the second substrate, wherein the insulating layer fully covers the mesh pattern.

17. The foldable display device according to claim 12, wherein openings of the mesh pattern in the folding boundary area gradually increase in size as getting farther away from the folding area.

18. The foldable display device according to claim 12, further comprising:

a back plate between the support substrate and the first substrate, wherein the back plate is made of a transparent material.

19. The foldable display device according to claim 12, wherein the folding area includes a first folding area and a second folding area spaced apart from the first folding area, and the first folding area is an in-folding area and the second folding area is an out-folding area.

20. The foldable display device according to claim 19, wherein openings of the mesh pattern in the first folding area are identical in size to openings of the mesh pattern in the second folding area.

* * * * *